(12) United States Patent
Lu et al.

(10) Patent No.: US 11,322,577 B2
(45) Date of Patent: *May 3, 2022

(54) NEGATIVE CAPACITANCE FET WITH IMPROVED RELIABILITY PERFORMANCE

(71) Applicant: Taiwan Semiconductor Manufacturing Co., Ltd., Hsinchu (TW)

(72) Inventors: Chun-Chieh Lu, Taipei (TW); Cheng-Yi Peng, Taipei (TW); Chien-Hsing Lee, New Taipei (TW); Ling-Yen Yeh, Hsinchu (TW); Chih-Sheng Chang, Hsinchu (TW); Carlos H. Diaz, Mountain View, CA (US)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/983,456

(22) Filed: Aug. 3, 2020

(65) Prior Publication Data

US 2020/0365682 A1 Nov. 19, 2020

Related U.S. Application Data

(63) Continuation of application No. 16/392,158, filed on Apr. 23, 2019, now Pat. No. 10,734,472, which is a (Continued)

(51) Int. Cl.
*H01L 49/02* (2006.01)
*H01L 27/1159* (2017.01)
(Continued)

(52) U.S. Cl.
CPC .......... *H01L 28/40* (2013.01); *H01L 21/0201* (2013.01); *H01L 21/02104* (2013.01);
(Continued)

(58) Field of Classification Search
CPC ................. H01L 28/40; H01L 27/1159; H01L 29/78391; H01L 29/40111;
(Continued)

(56) References Cited

U.S. PATENT DOCUMENTS 6,495,878 B1 12/2002 Hayashi et al.
7,425,740 B2 9/2008 Liu et al.
(Continued)

FOREIGN PATENT DOCUMENTS

CN 107004586 A 8/2017
JP 2002203916 7/2002
(Continued)

OTHER PUBLICATIONS

Kang, C.Y., et al., "Reliability Characteristics of La-doped High-k/Metal Gate nMOSFETs", Journal of Semiconductor Technology and Science, vol. 9, No. 3, pp. 166-173 (2009).
(Continued)

*Primary Examiner* — Earl N Taylor
(74) *Attorney, Agent, or Firm* — Haynes and Boone, LLP

(57) ABSTRACT

A negative capacitance device includes a semiconductor layer. An interfacial layer is disposed over the semiconductor layer. An amorphous dielectric layer is disposed over the interfacial layer. A ferroelectric layer is disposed over the amorphous dielectric layer. A metal gate electrode is disposed over the ferroelectric layer. At least one of the following is true: the interfacial layer is doped; the amorphous dielectric layer has a nitridized outer surface; a diffusion-barrier layer is disposed between the amorphous dielectric layer and the ferroelectric layer; or a seed layer is
(Continued)

disposed between the amorphous dielectric layer and the ferroelectric layer.

20 Claims, 19 Drawing Sheets

Related U.S. Application Data continuation of application No. 15/795,610, filed on Oct. 27, 2017, now Pat. No. 10,276,697.

(51) Int. Cl.
| | |
|---|---|
| *H01L 21/02* | (2006.01) |
| *H01L 29/78* | (2006.01) |
| *H01L 21/28* | (2006.01) |
| *H01L 27/11585* | (2017.01) |
| *H01L 29/51* | (2006.01) |
| *H01L 29/66* | (2006.01) |

(52) U.S. Cl.
CPC .... *H01L 27/1159* (2013.01); *H01L 27/11585* (2013.01); *H01L 29/40111* (2019.08); *H01L 29/516* (2013.01); *H01L 29/6684* (2013.01); *H01L 29/78391* (2014.09)

(58) Field of Classification Search
CPC ............. H01L 27/11585; H01L 29/516; H01L 29/6684; H01L 21/02104; H01L 21/0201; H01L 21/28202; H01L 29/517; H01L 29/518; H01L 29/513; H01L 29/785; H01L 21/823431; H01L 29/66795; H01L 29/66545; H01L 29/66446; H01L 29/92
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,048,723 B2 | 11/2011 | Chang et al. | |
| 8,053,299 B2 | 11/2011 | Xu | |
| 8,183,627 B2 | 5/2012 | Currie | |
| 8,362,575 B2 | 1/2013 | Kwok et al. | |
| 8,367,498 B2 | 2/2013 | Chang et al. | |
| 8,377,779 B1 | 2/2013 | Wang | |
| 8,399,931 B2 | 3/2013 | Liaw et al. | |
| 8,415,718 B2 | 4/2013 | Xu | |
| 8,440,517 B2 | 5/2013 | Lin et al. | |
| 8,487,378 B2 | 7/2013 | Goto et al. | |
| 8,497,177 B1* | 7/2013 | Chang ............... H01L 29/66795 438/283 |
| 8,497,528 B2 | 7/2013 | Lee et al. | |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,652,894 B2 | 2/2014 | Lin et al. | |
| 8,680,576 B2 | 3/2014 | Ching et al. | |
| 8,686,516 B2 | 4/2014 | Chen et al. | |
| 8,703,565 B2 | 4/2014 | Chang et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 | 5/2014 | Lee et al. | |
| 8,742,509 B2 | 6/2014 | Lee et al. | |
| 8,772,109 B2 | 7/2014 | Colinge | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,826,213 B1 | 9/2014 | Ho et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,887,106 B2 | 11/2014 | Ho et al. | |
| 9,105,490 B2 | 8/2015 | Wang et al. | |
| 9,722,093 B1 | 8/2017 | Xing et al. | |
| 9,793,397 B1* | 10/2017 | Ando ................... H01L 29/4966 |
| 9,853,150 B1* | 12/2017 | Colinge ............ H01L 29/40111 |
| 9,871,136 B2* | 1/2018 | Chen ..................... H01L 29/516 |
| 10,229,921 B2* | 3/2019 | Ando ....................... H01L 28/82 |
| 10,276,697 B1* | 4/2019 | Lu ........................ H01L 21/0201 |
| 10,734,472 B2* | 8/2020 | Lu ........................ H01L 21/02104 |
| 2002/0040847 A1* | 4/2002 | Ohmi ................ H01L 21/02247 204/192.22 |
| 2002/0158250 A1* | 10/2002 | Fujisaki ................ H01L 29/513 257/64 |
| 2003/0109069 A1 | 6/2003 | Li et al. | |
| 2003/0194853 A1 | 10/2003 | Jeon | |
| 2004/0124455 A1 | 7/2004 | Lee et al. | |
| 2005/0233525 A1 | 10/2005 | Yeo et al. | |
| 2006/0017120 A1 | 1/2006 | Sakai | |
| 2006/0073614 A1* | 4/2006 | Hara ..................... H01L 27/1159 438/3 |
| 2006/0081901 A1* | 4/2006 | Arimoto ............ H01L 29/78391 257/295 |
| 2006/0081939 A1* | 4/2006 | Akasaka ......... H01L 21/823857 257/371 |
| 2010/0123177 A1* | 5/2010 | Ozaki ................ H01L 27/11504 257/295 |
| 2010/0208522 A1* | 8/2010 | Hayashi ............ H01L 29/42336 365/185.18 |
| 2011/0068407 A1 | 3/2011 | Yeh et al. | |
| 2011/0207313 A1 | 8/2011 | Lim et al. | |
| 2011/0227143 A1* | 9/2011 | Lee .................... H01L 27/10808 257/325 |
| 2012/0018814 A1 | 1/2012 | Morooka | |
| 2012/0139055 A1 | 6/2012 | Sato et al. | |
| 2013/0011983 A1 | 1/2013 | Tsai et al. | |
| 2013/0270619 A1* | 10/2013 | Schloesser ........ H01L 29/40111 257/295 |
| 2013/0285153 A1 | 10/2013 | Lee et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0183600 A1 | 7/2014 | Huang et al. | |
| 2014/0252412 A1 | 9/2014 | Tsai et al. | |
| 2014/0264590 A1 | 9/2014 | Yu et al. | |
| 2014/0264592 A1 | 9/2014 | Oxland et al. | |
| 2014/0282326 A1 | 9/2014 | Chen et al. | |
| 2014/0363962 A1 | 12/2014 | Hou et al. | |
| 2015/0263003 A1 | 9/2015 | Lee et al. | |
| 2016/0064664 A1* | 3/2016 | Dang .................... H01L 45/146 257/4 |
| 2016/0308021 A1* | 10/2016 | Lee .................... H01L 21/02266 |
| 2017/0005195 A1* | 1/2017 | Ching ................... H01L 29/165 |
| 2017/0040331 A1* | 2/2017 | Van Houdt ........... H01L 29/516 |
| 2017/0141235 A1* | 5/2017 | Lai ..................... H01L 29/78391 |
| 2017/0170027 A1 | 6/2017 | Hou et al. | |
| 2017/0178712 A1* | 6/2017 | Van Houdt ........... G11C 11/223 |
| 2017/0221898 A1 | 8/2017 | Ando et al. | |
| 2017/0358684 A1* | 12/2017 | Chen ................ H01L 29/40111 |
| 2018/0006129 A1* | 1/2018 | Xing .................. H01L 29/42376 |
| 2018/0226415 A1* | 8/2018 | Ando ................ H01L 27/11507 |
| 2018/0297365 A1* | 10/2018 | Nakayama ............. B41J 2/1628 |
| 2019/0131382 A1* | 5/2019 | Lu ........................ H01L 29/785 |

(56) References Cited

U.S. PATENT DOCUMENTS

2019/0252489 A1* 8/2019 Lu .................. H01L 29/513
2020/0365682 A1* 11/2020 Lu .................. H01L 27/1159

FOREIGN PATENT DOCUMENTS

| JP | 2011044580 | 3/2011 |
|----|------------|--------|
| JP | 2012028418 | 2/2012 |
| KR | 100481853 | 4/2005 |
| KR | 20140004855 | 1/2014 |

OTHER PUBLICATIONS

Hsu, Chia-Wei, et al., "Improving Hf-based High-k/Metal Gate n-MOSFET Performances with Gadolinium Cap Layer", Institute of Microelectronics, National Cheng Kung University, 2. pgs.

Li, Kai-Shin, et al., "Sub-60mV-Swing Negative-Capacitance FinFETwithout Hysteresis", National Nano Device Laboratories, National Applied Research Laboratories, 4 pgs.

Zhou, Jiuren, et al., "Ferroelectric HfZrO$_x$ Ge and GeSn PMOSFETs with Sub-60 mV/decade Subthreshold Swing, Negligible Hysteresis, and Improved I$_{DS}$", State Key Discipline Laboratory of Wide Band Gap Semiconductor Technology, School of Microelectronics, 4 pgs.

Lee, M.H., et al., "Physical Thickness 1.x nm Ferroelectric HfZrO$_x$ Negative Capacitance FETs", Institute of Electro-Optical Science and Technology, National Taiwan Normal University, 4 pgs.

Kim, Han Joon, et al., "Grain Size Engineering for Ferroelectric Hf$_{0.5}$Zr$_{0.5}$O$_2$ films by an insertion of Al$_2$O$_3$ Interlayer", Applied Physics Letters, vol. 105, No. 192903, 6 pgs. (2014).

Lin, Bo-Ting, et al., "Induction of Ferroelectricity in Nanoscale ZrO$_2$ Thin Films on Pt Electrode without Post-Annealing", Journal of the European Ceramic Society, vol. 37, pp. 1135-1139 (2017).

* cited by examiner

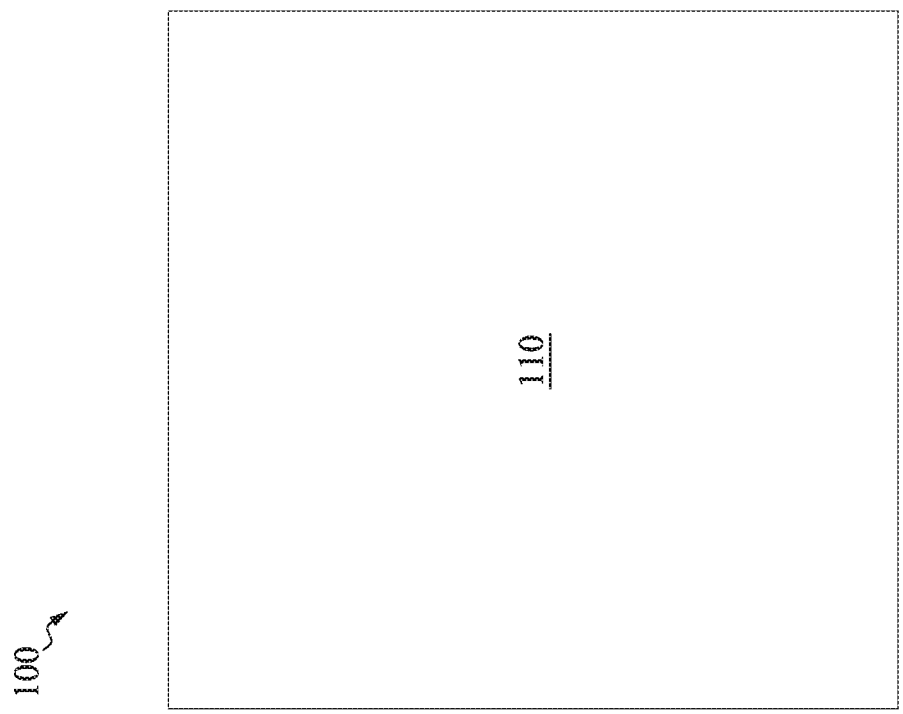
Fig. 2B (Y-cut)
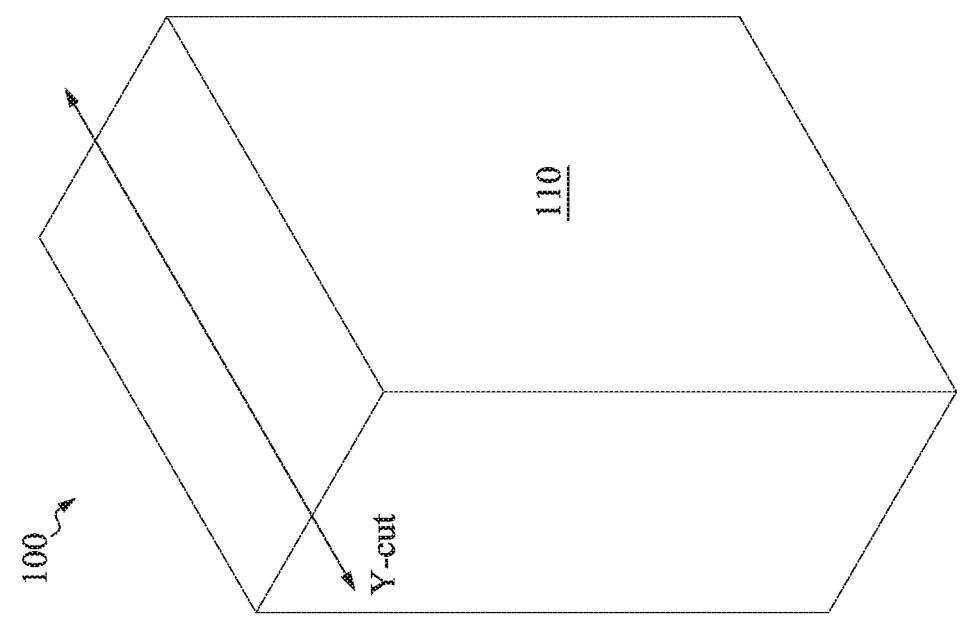
Fig. 2A

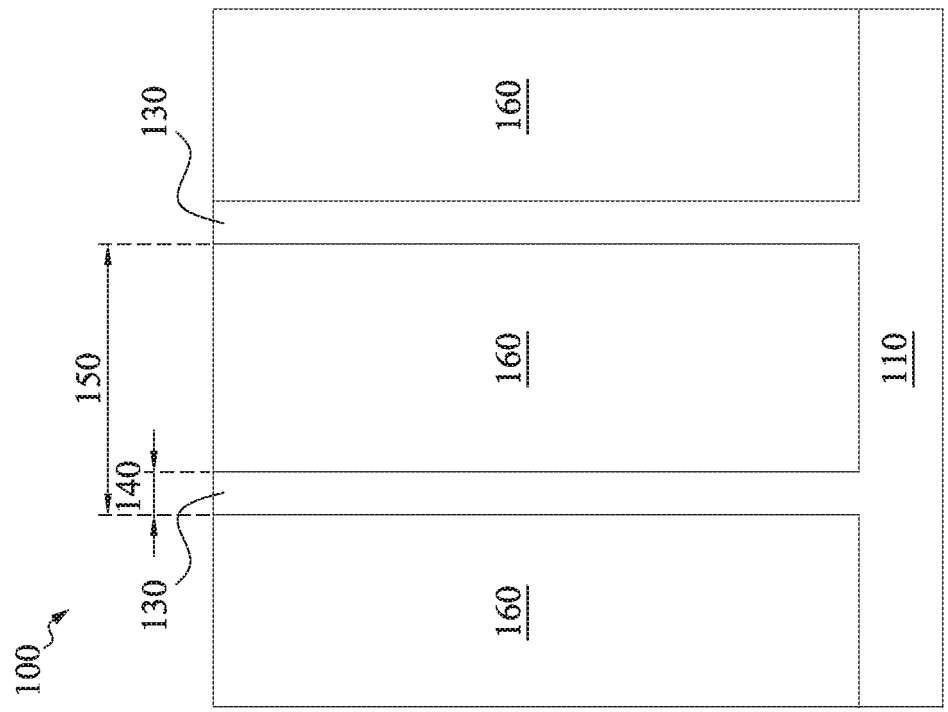
Fig. 3B (Y-cut)
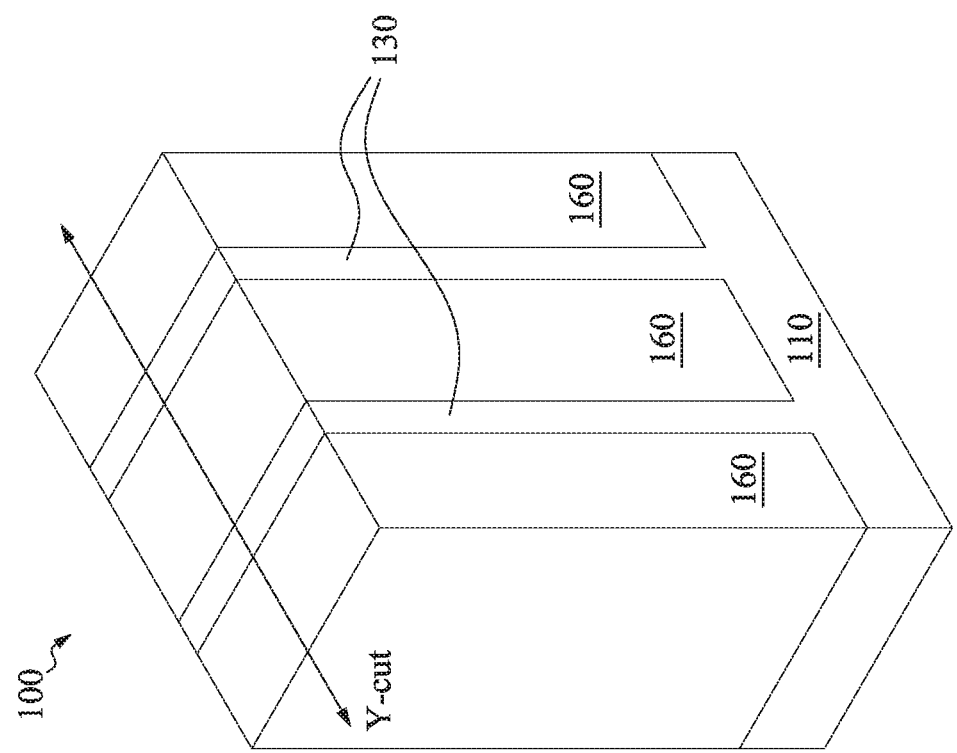
Fig. 3A

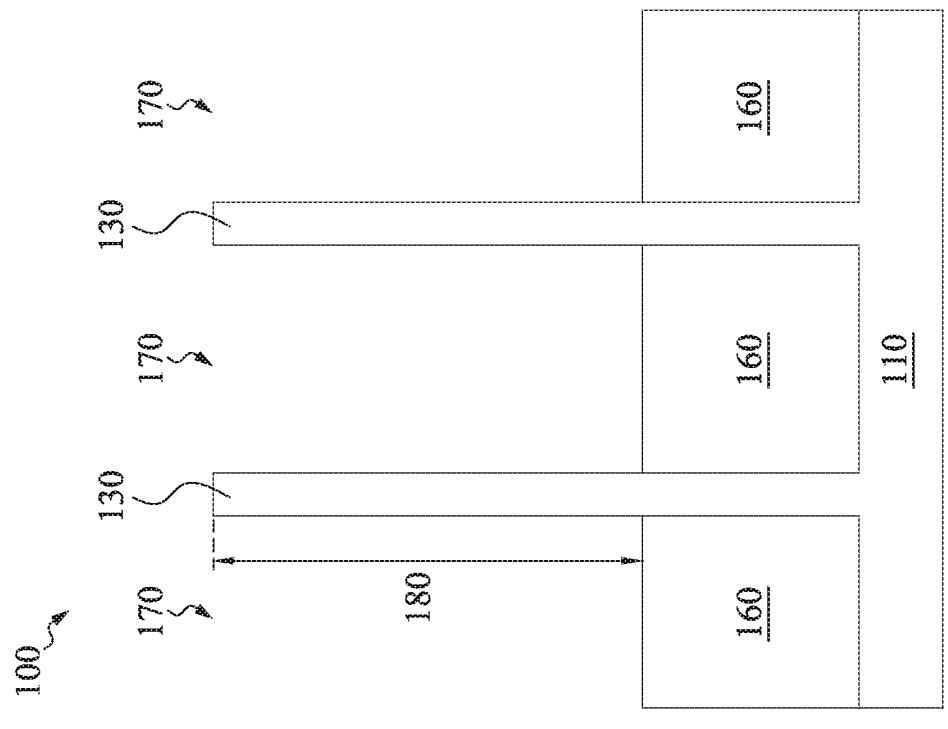
Fig. 4B (Y-cut)
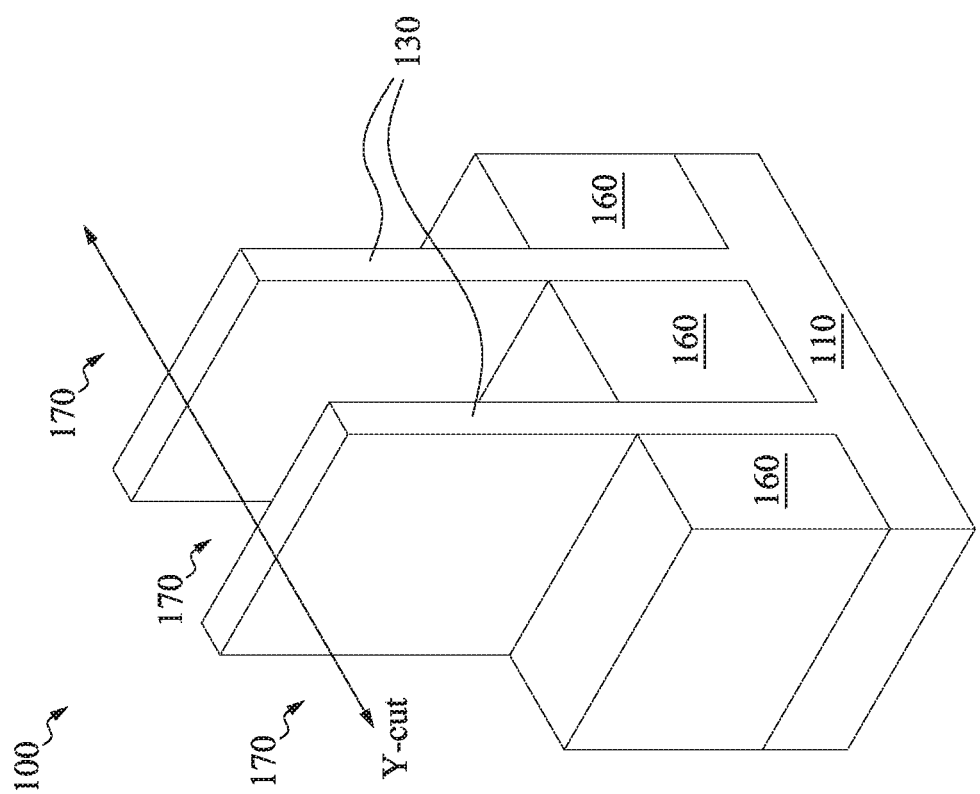
Fig. 4A

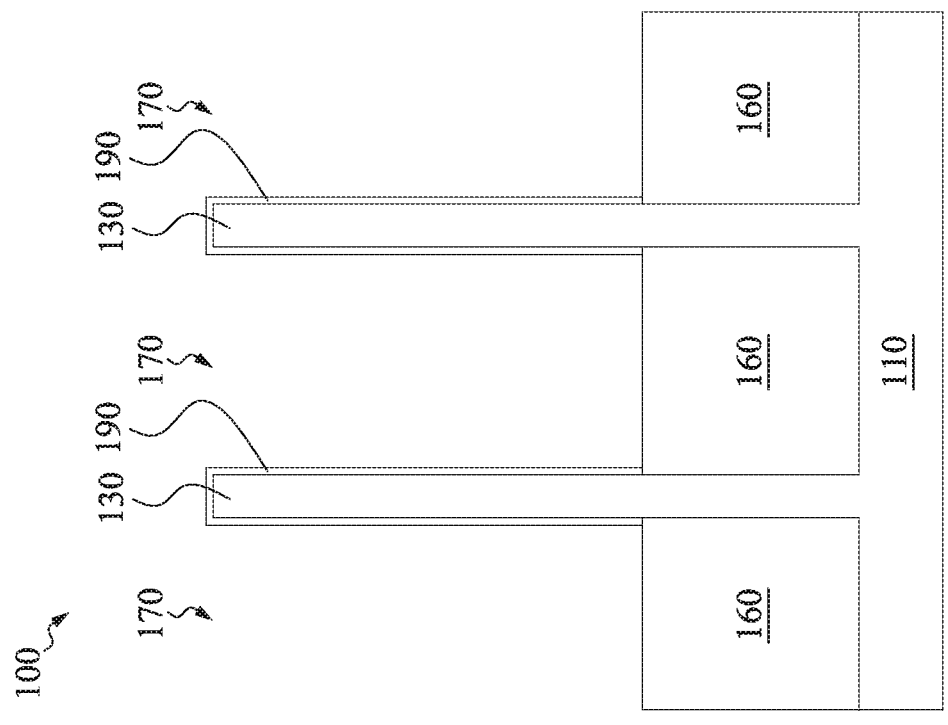
Fig. 5B (Y-cut)
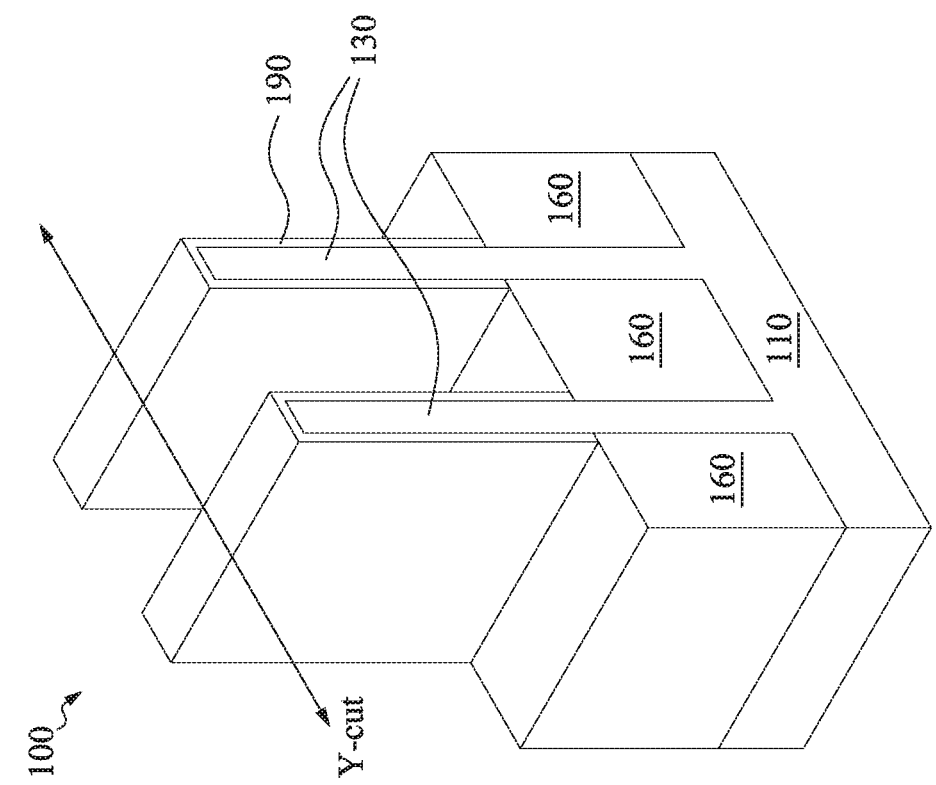
Fig. 5A

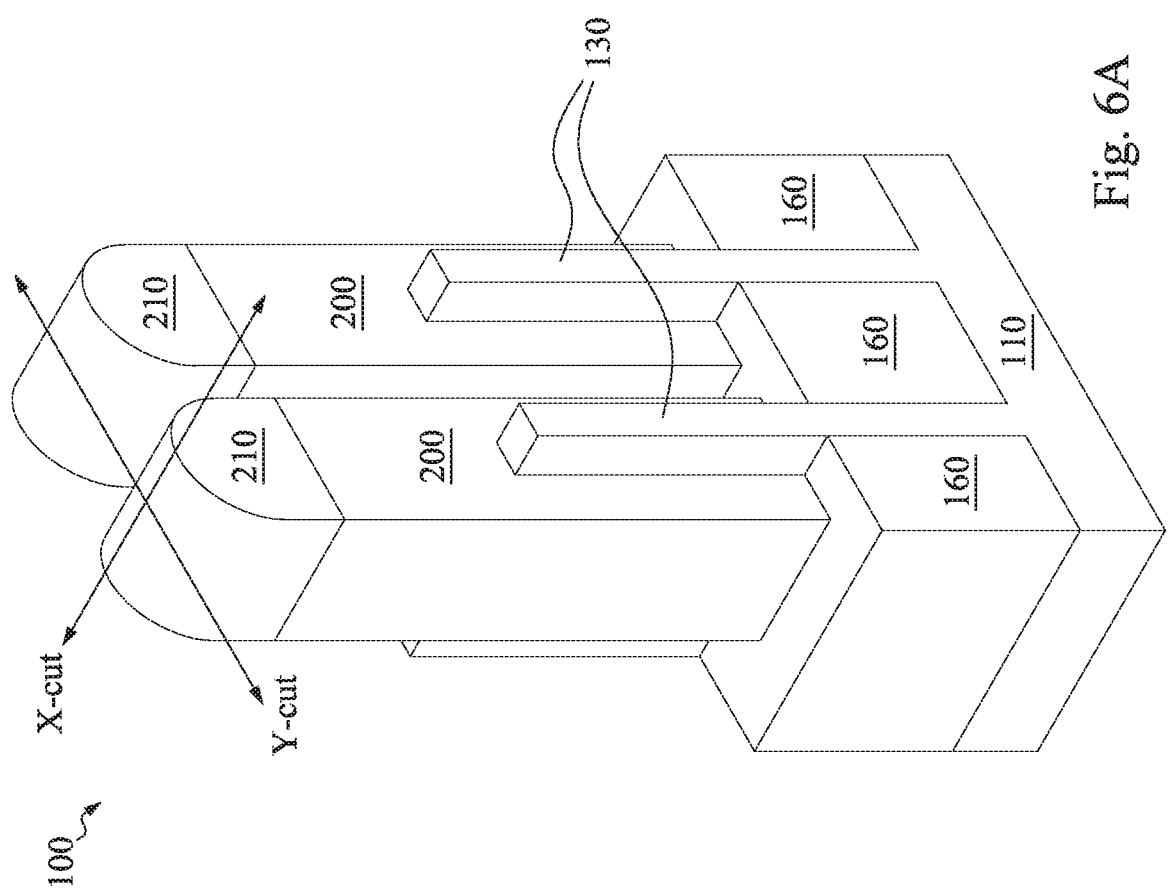

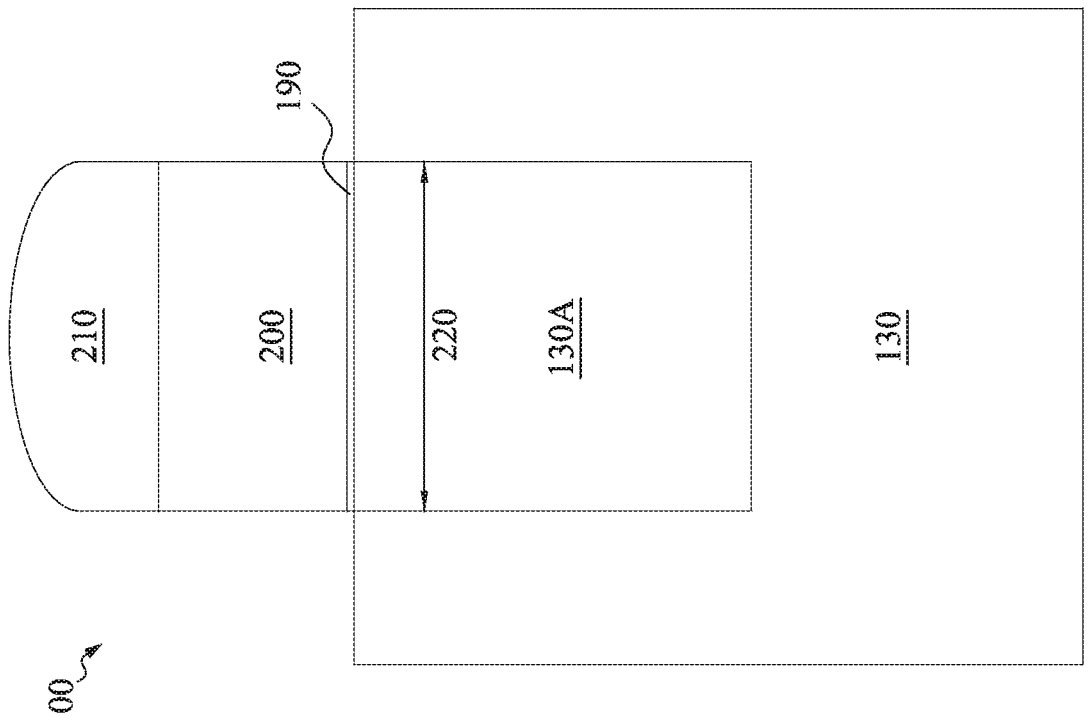
Fig. 6C (X-cut)
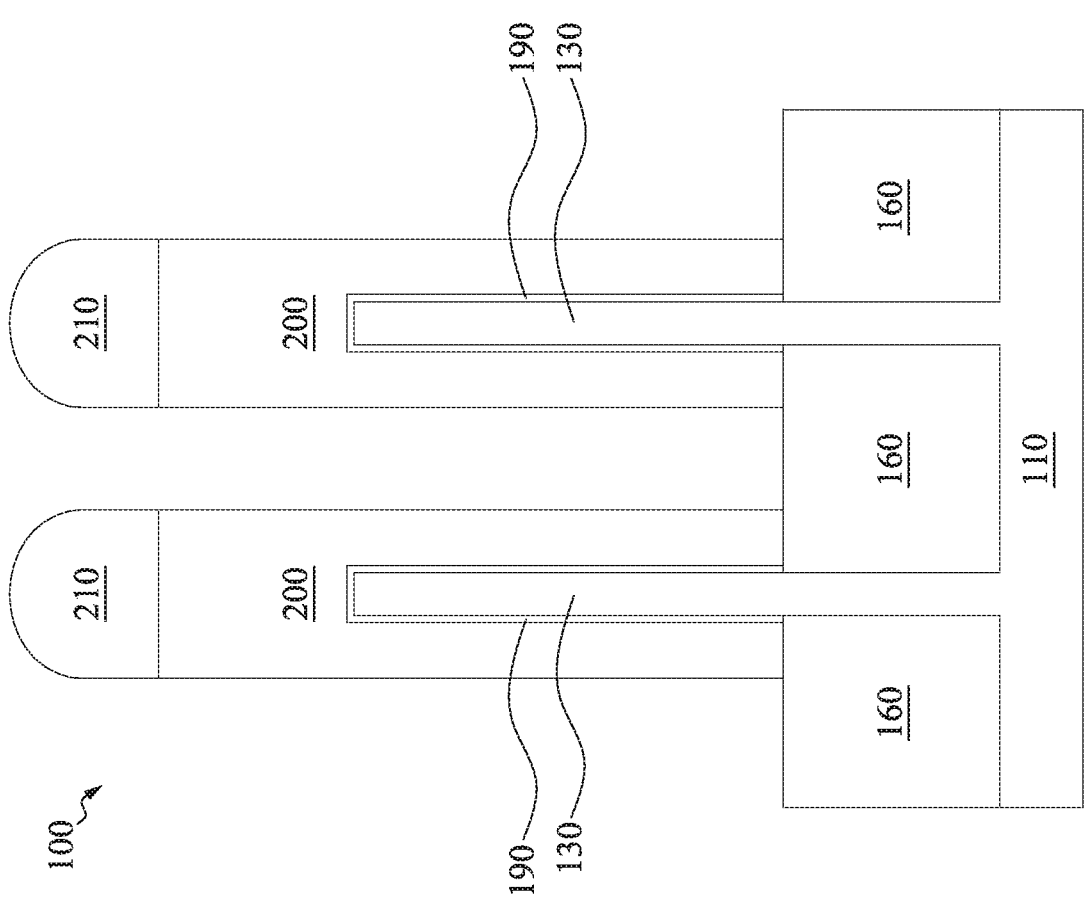
Fig. 6B (Y-cut)

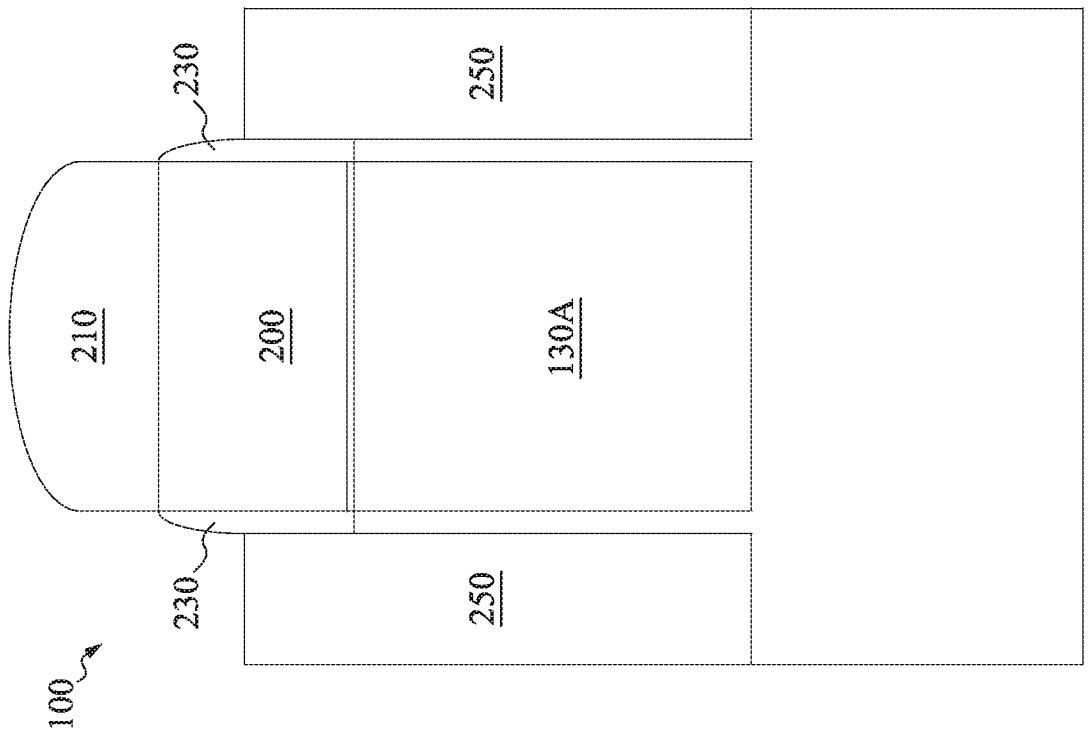
Fig. 7C (X-cut)
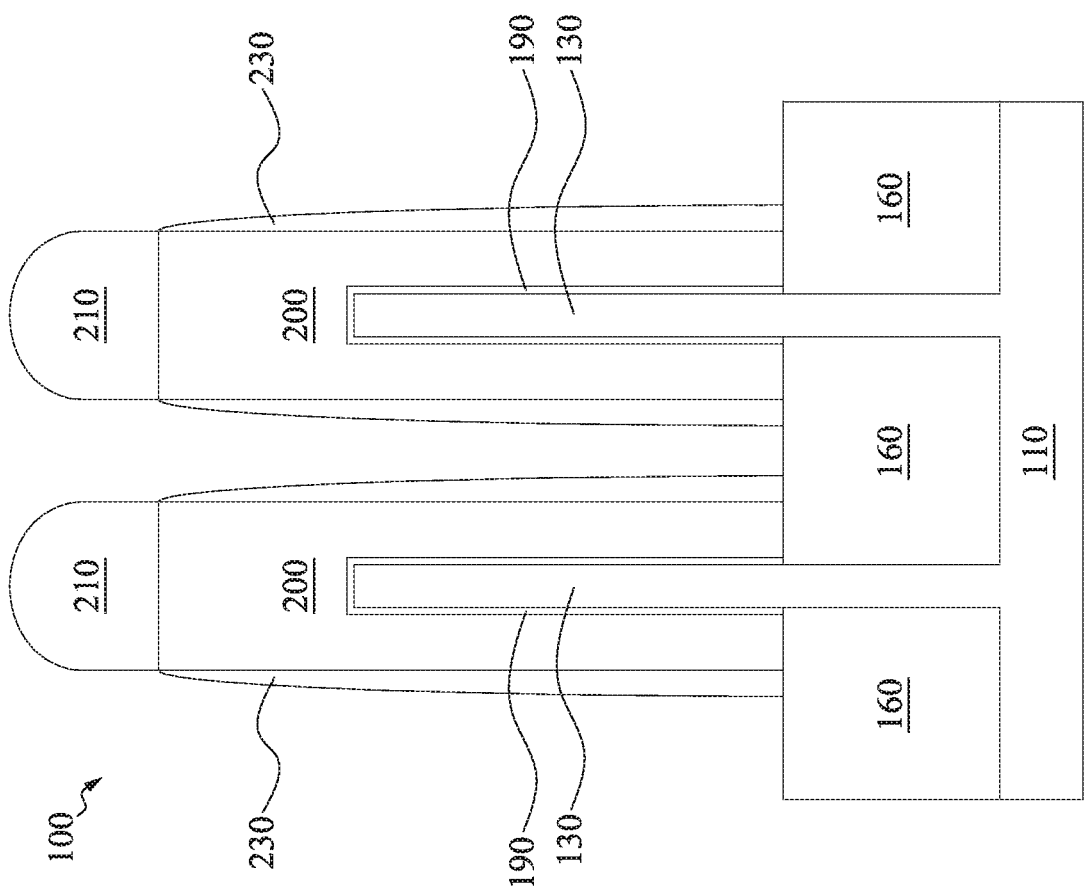
Fig. 7B (Y-cut)

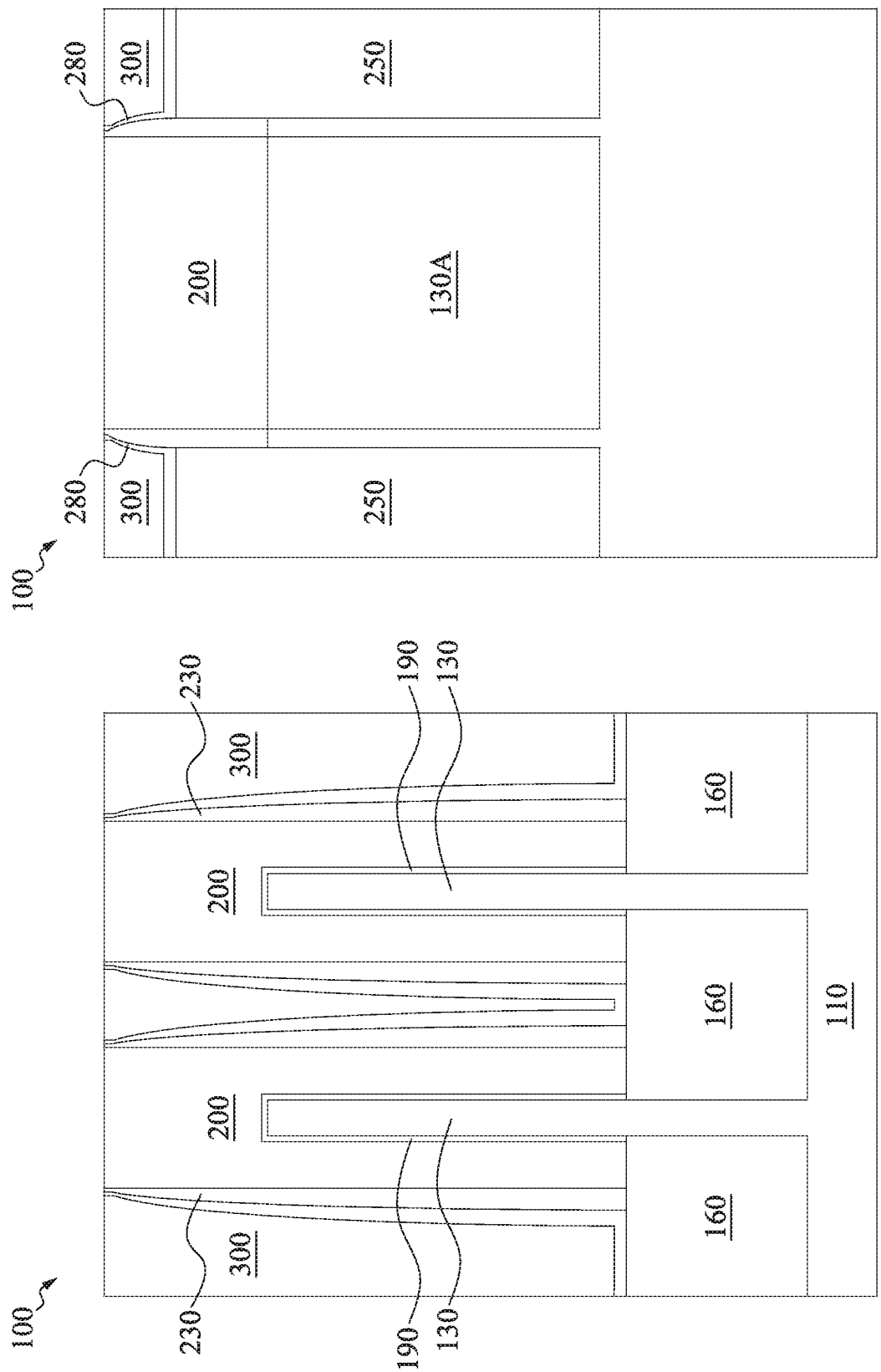

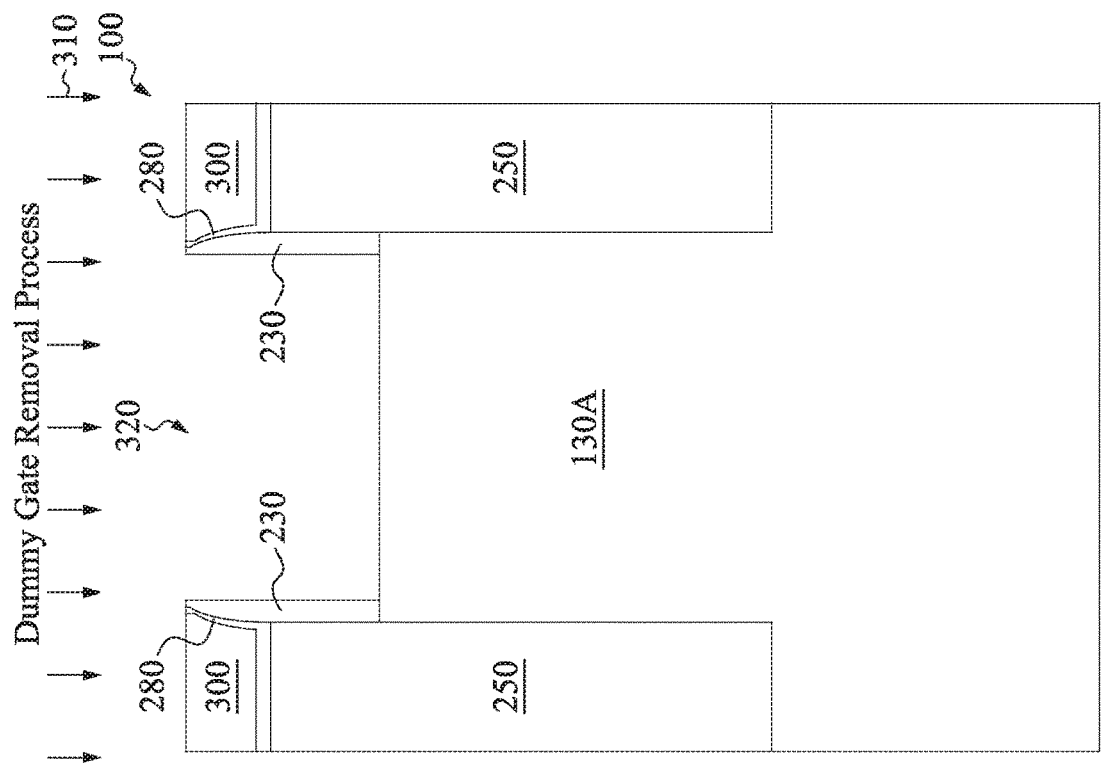
Fig. 9C (X-cut)
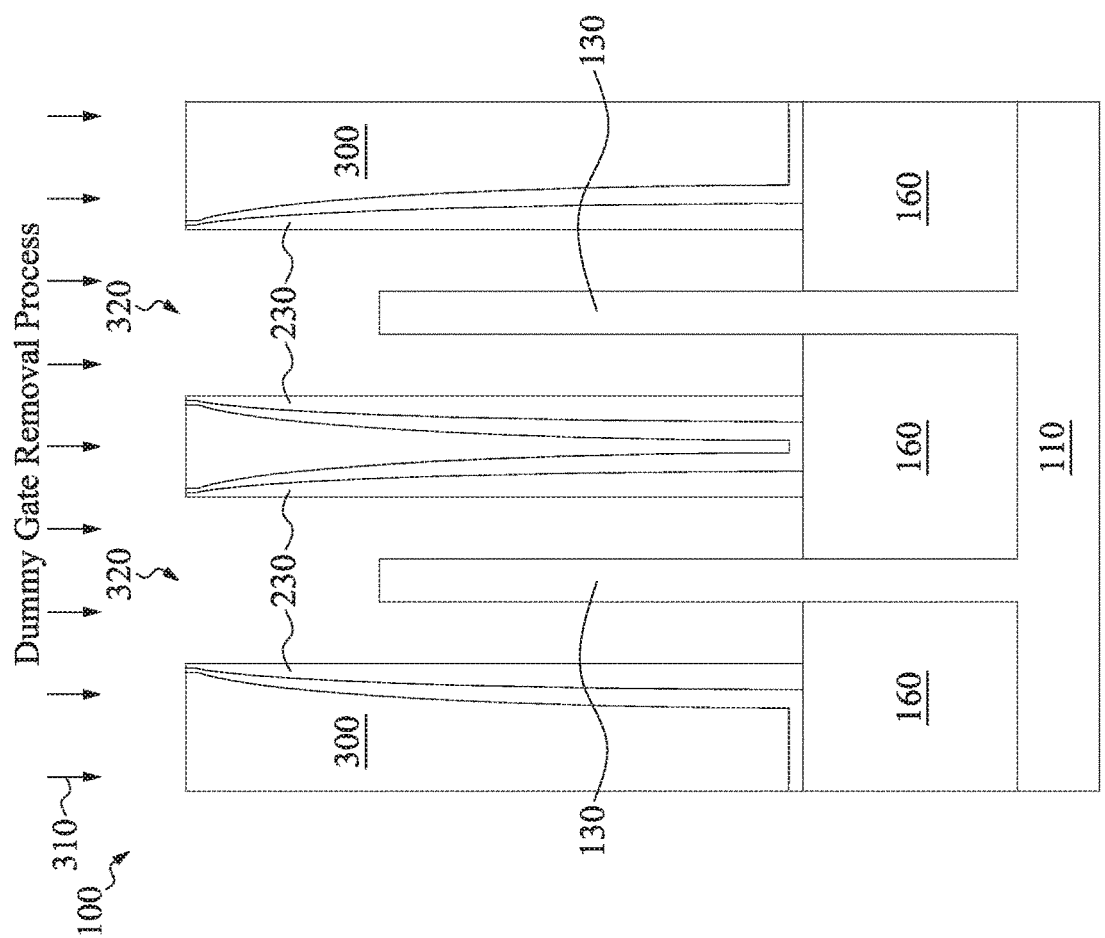
Fig. 9B (Y-cut)

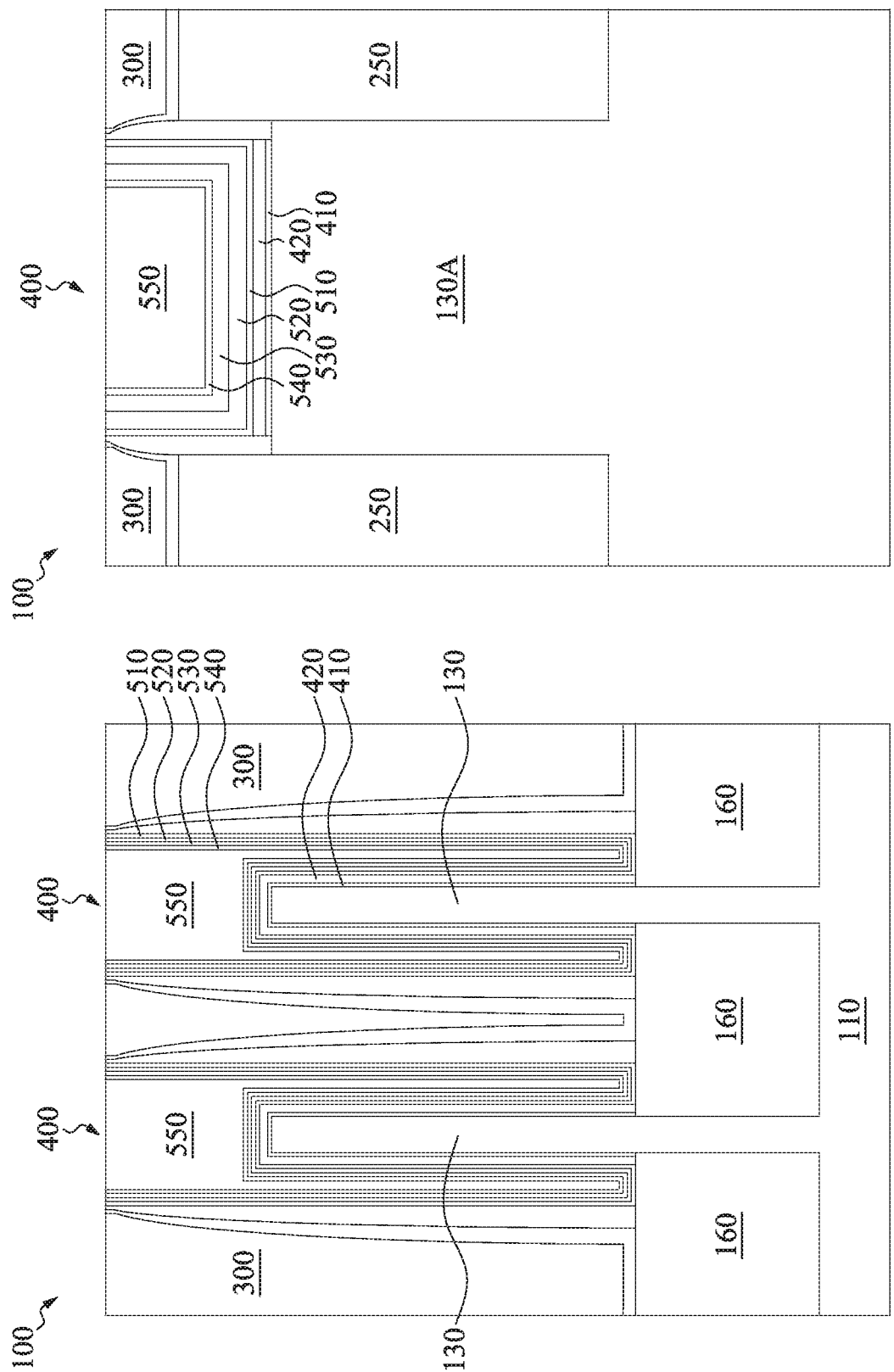

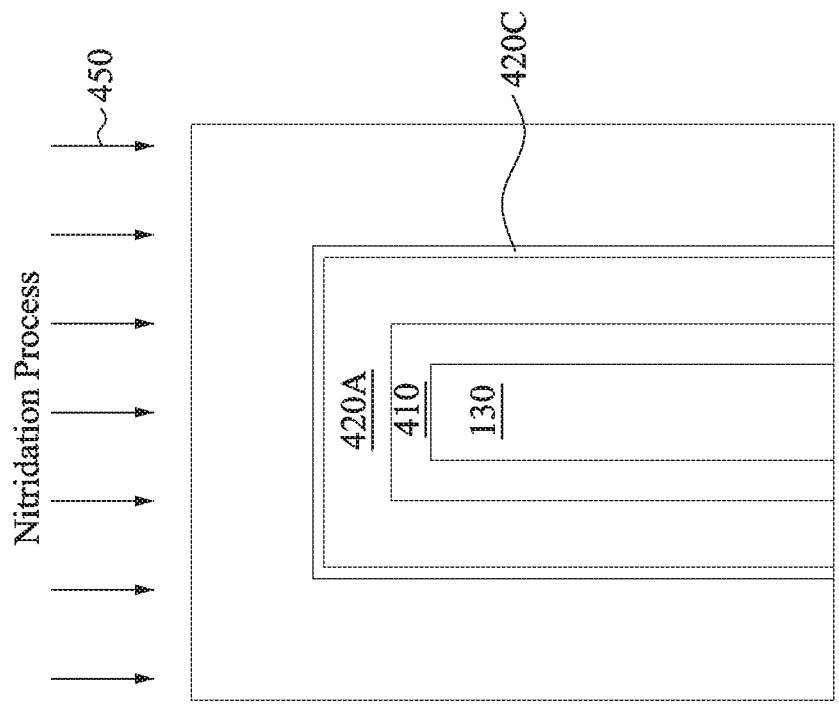
Fig. 12 (Y-cut)
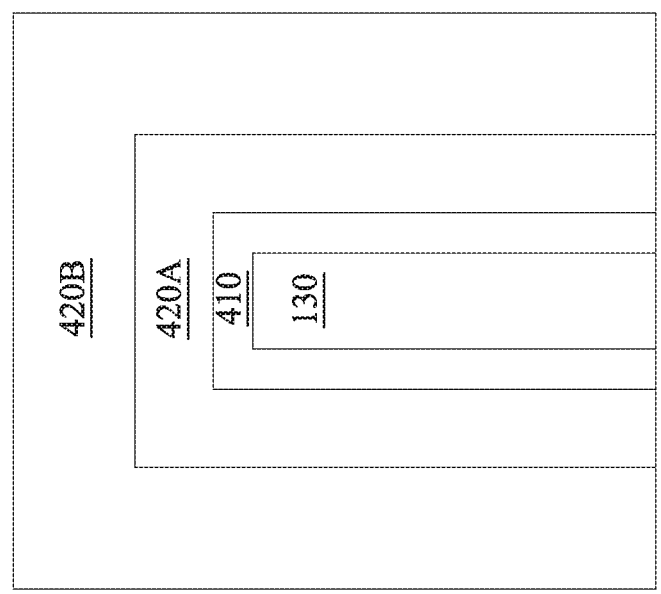
Fig. 11 (Y-cut)

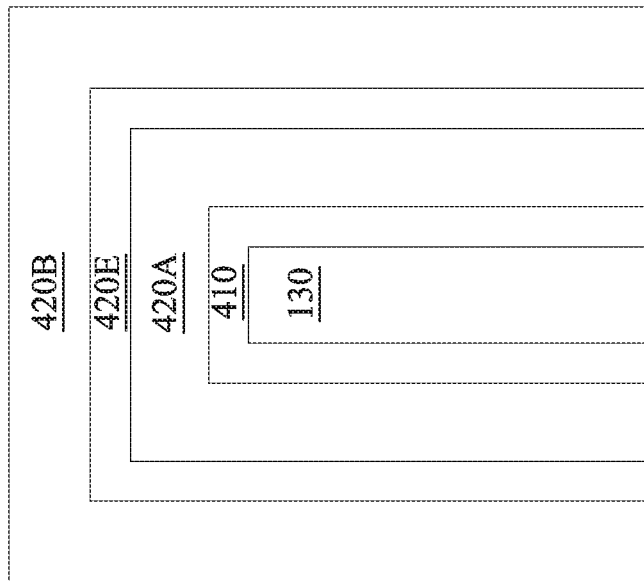
Fig. 14 (Y-cut)
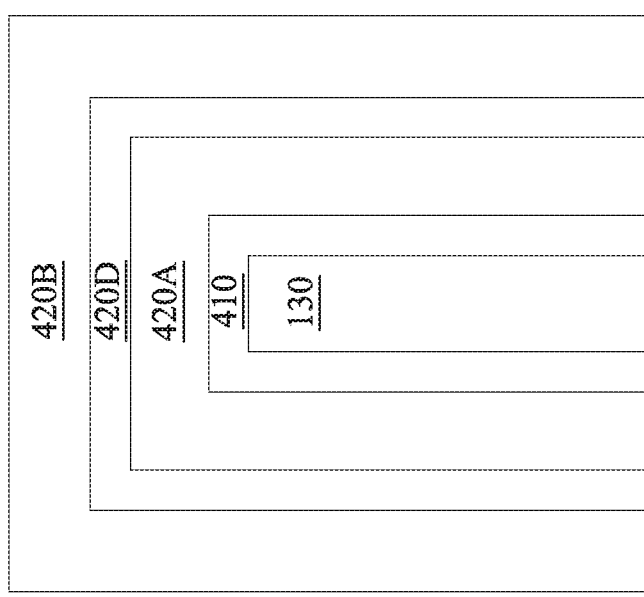
Fig. 13 (Y-cut)

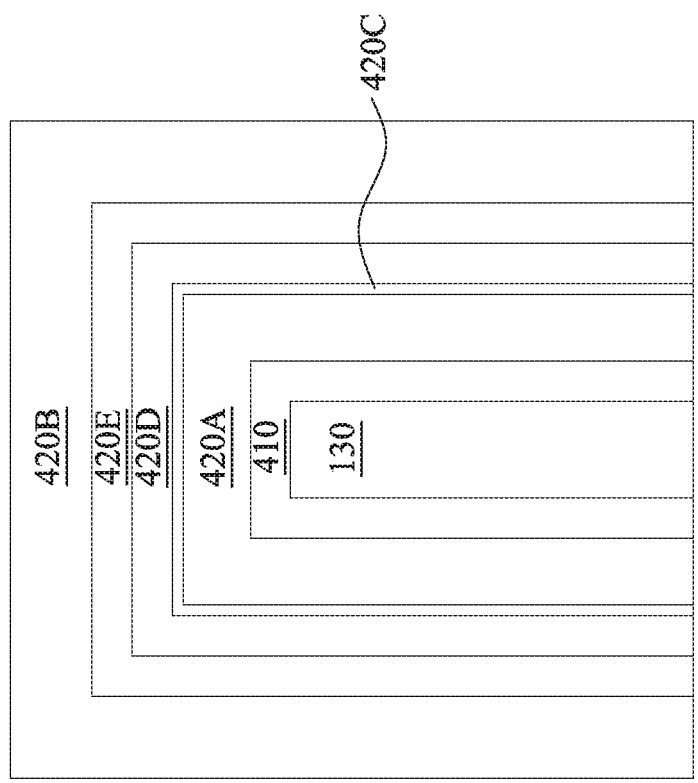
Fig. 15 (Y-cut)

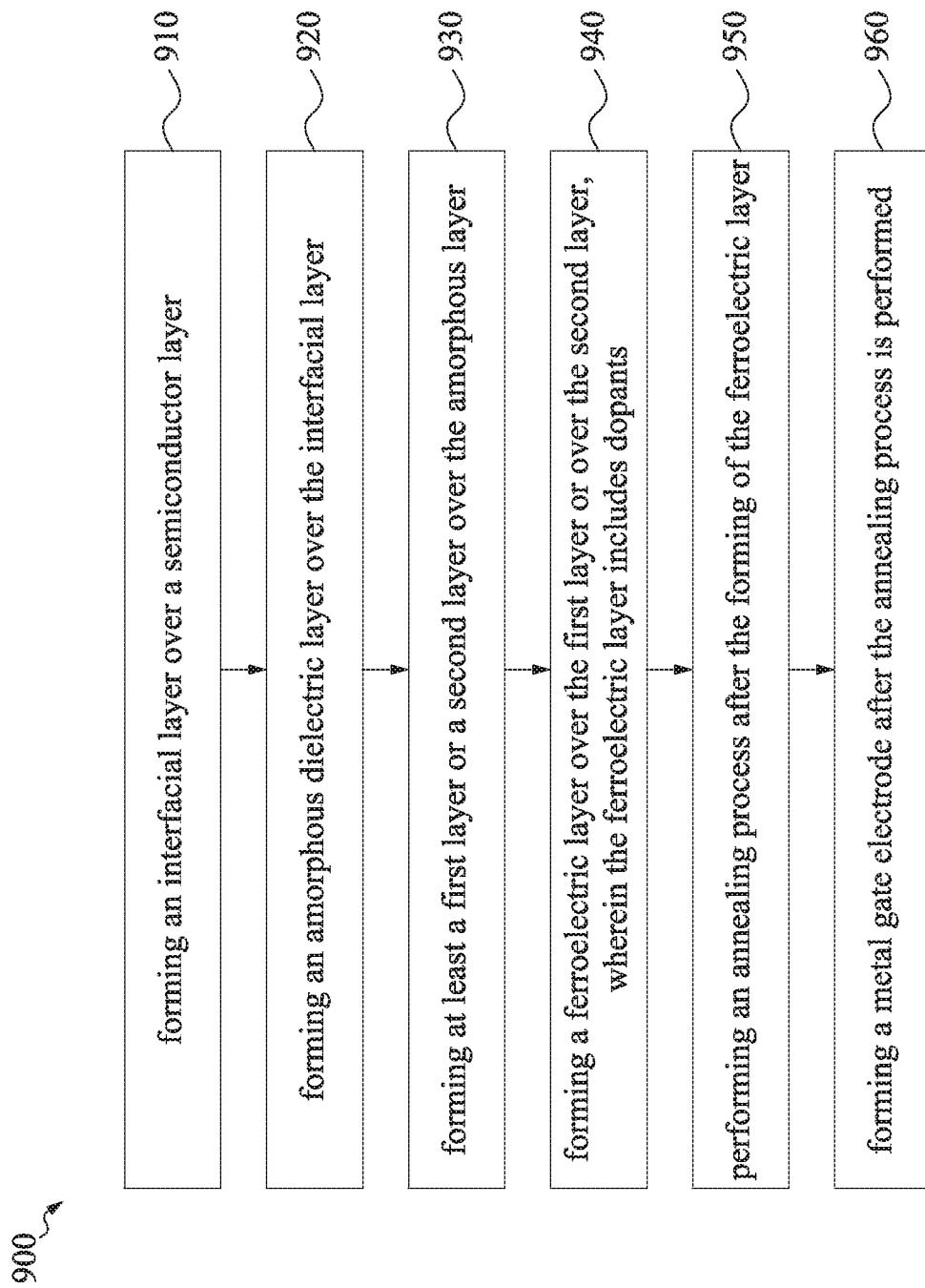

NEGATIVE CAPACITANCE FET WITH IMPROVED RELIABILITY PERFORMANCE

PRIORITY DATA

The present application is a continuation of U.S. patent application Ser. No. 16/392,158, filed Apr. 23, 2019, which is a continuation of U.S. patent application Ser. No. 15/795,610, filed Oct. 27, 2017, now U.S. Pat. No. 10,276,697, issued Apr. 30, 2019, the disclosures of which are hereby incorporated by reference in their entirety.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

Transistors are circuit components or elements that are often formed as a part of semiconductor fabrication. A field effect transistor (FET) is one type of transistor. Typically, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate. FETs can be used as negative capacitance devices. However, existing negative-capacitance FETs may still have shortcomings, such as shortcomings with respect to reliability.

Therefore, although existing negative-capacitance FETs have been generally adequate for their intended purposes, they have not been entirely satisfactory in every aspect. For an example, negative-capacitance FETs with improved reliability are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-10A are three-dimensional perspective views of a FinFET device at different stages of fabrication according to various embodiments of the present disclosure.

FIGS. 2B-10B are cross-sectional side views of a FinFET device cut along a Y-axis at different stages of fabrication according to various embodiments of the present disclosure.

FIGS. 6C-10C are cross-sectional side views of a FinFET device cut along an X-axis at different stages of fabrication according to various embodiments of the present disclosure.

FIGS. 11-15 are cross-sectional side views of a magnified portion of a FinFET device according to various embodiments of the present disclosure.

FIG. 16 is a flow chart of a method for fabricating a FinFET device in accordance with embodiments of the present disclosure.

DETAILED DESCRIPTION

Figure 1:
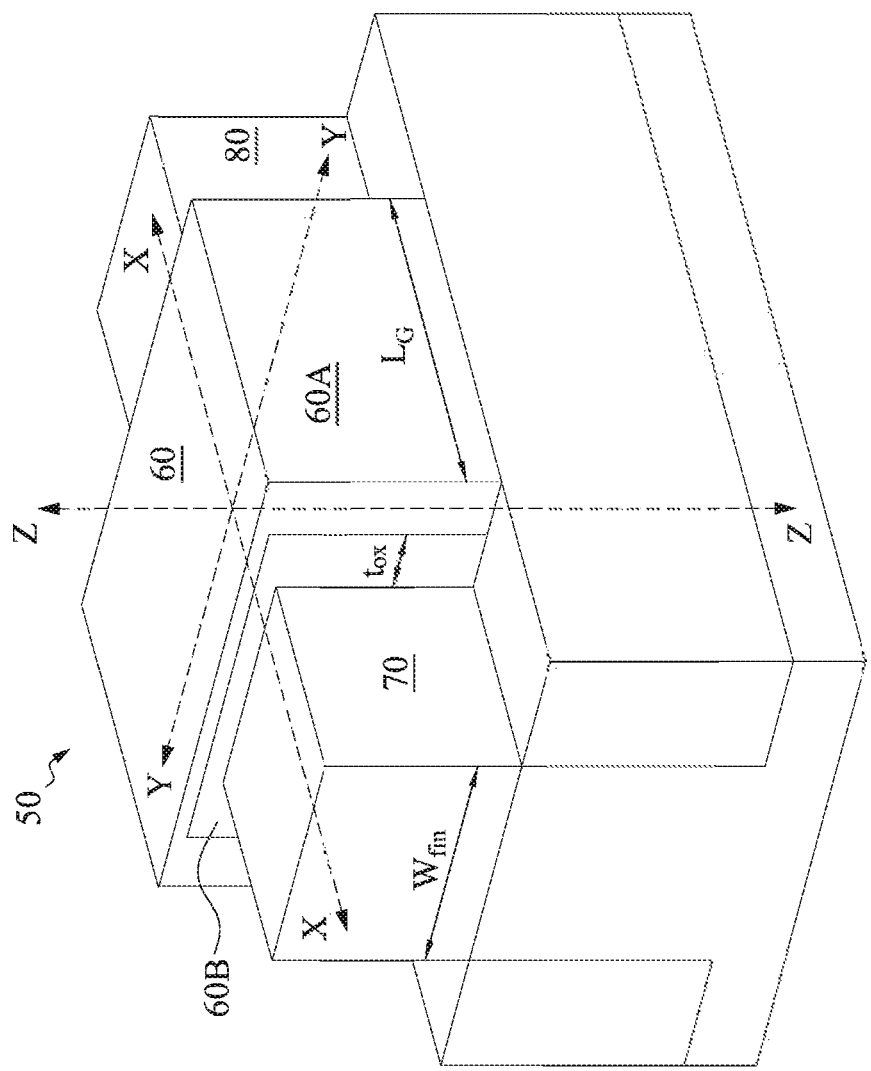
FIG. 1 is a perspective view of an example FinFET device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Ferroelectric materials, with proper dopant concentration and post annealing conditions, can achieve a negative-capacitance (NC) effect for field effect transistors (FETs). The NC effect can be useful in certain circuit applications. However, existing negative-capacitance FETs and the method of their fabricating still have shortcomings. For example, the fabrication of a negative-capacitance FET may involve high temperature environments, such as during annealing processes. The high temperature environments may cause dopants to diffuse between different layers of the negative-capacitance FET. This dopant diffusion is undesirable because it may lead to a higher voltage drop on certain layers of the negative-capacitance FET, which could wear out these layers sooner than expected. As these layers are worn out, the overall negative-capacitance FET may have degraded performance or even fail. For these reasons, existing negative-capacitance FETs may still have problems with respect to reliability.

To overcome the problems associated with existing negative-capacitance FETs, the present disclosure involves performing treatment processes to the various layers of negative-capacitance FETs and/or forming additional layers for the negative-capacitance FETs, in order to improve the reliability of the negative-capacitance FETs. As an example of the negative-capacitance FET, the various aspects of the present disclosure are discussed below with reference to a fin-like field-effect transistor (FinFET) device, which has been gaining popularity in the semiconductor industry recently. The FinFET device may be a complementary metal-oxide-semiconductor (CMOS) device including a P-type metal-oxide-semiconductor FinFET device and an N-type metal-oxide-semiconductor FinFET device. It is understood, however, that the present application should not be limited to a particular type of device, except as specifically claimed.

Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

FinFET devices offer several advantages over traditional Metal-Oxide Semiconductor Field Effect Transistor (MOSFET) devices (also referred to as planar transistor devices) that do not have a protruding fin structure. These advantages may include better chip area efficiency, improved carrier mobility, and fabrication processing that is compatible with the fabrication processing of planar devices. FinFET devices are also compatible with a high-k metal gate (HKMG) process flow. Thus, FinFET devices may be implemented as HKMG devices where the gates each that have a high-k gate dielectric and a metal gate electrode. For these benefits discussed above, it may be desirable to design an integrated circuit (IC) chip using FinFET devices for a portion of, or the entire IC chip.

FIGS. 2A-10A illustrate diagrammatic fragmentary three-dimensional perspective views of a FinFET device 100 at various stages of fabrication, FIGS. 2B-10B illustrate diagrammatic fragmentary cross-sectional side views of the FinFET device 100 at various stages of fabrication, and FIGS. 6C-10C illustrate different diagrammatic fragmentary cross-sectional side views of the FinFET device 100 at various stages of fabrication. The cross-sectional side views of FIGS. 2B-10B are obtained by "cutting" the FinFET device 100 along a Y-axis, and as such FIGS. 2B-10B may be referred to as Y-cut drawings. The cross-sectional side views of FIGS. 6C-10C are obtained by "cutting" the FinFET device 100 along an X-axis, and as such FIGS. 6C-10C may be referred to as X-cut drawings.

Referring to FIGS. 2A and 2B, the FinFET device 100 includes a semiconductor layer 110. In an embodiment, the semiconductor layer 110 includes a crystal silicon material. In other embodiments, the semiconductor layer may include SiGe, Ge, GeSn, SiGen, or a III-V group compound. It is also understood that the semiconductor layer may be a single-layer structure or a multi-layer structure.

An implantation process may be performed to implant a plurality of dopant ions to the semiconductor layer 110. The dopant ions may include an n-type material in some embodiments, for example arsenic (As) or phosphorous (P), or they may include a p-type material in some other embodiments, for example boron (B), depending on whether an NMOS or a PMOS is needed.

Referring now to FIGS. 3A-3B, the semiconductor layer 110 is patterned through one or more lithography processes to form fin structures (or fins) 130. It is understood that different portions of the fins 130 will serve as the source, drain, and channel regions of the FinFET device 100. The step of patterning of the semiconductor layer 110 to form the fins 130 may be referred to as fin definition. Note that the fins 130 each have a width 140, and a pitch 150 exists between the fins 130. In some embodiments, the width 140 is in a range from about 4 nanometers (nm) to about 8 nm. In some embodiments, the pitch 150 is in a range from about 12 nm to about 50 nm.

Still referring to FIGS. 3A-3B, isolation structures 160 are formed over the semiconductor layer 110 and in between the fins 130, so as to electrically isolate the fins 130. The isolation structures 160 may be shallow trench isolation (STI) structures. In some embodiments, the isolation structures 160 contain a dielectric material such as silicon oxide or silicon nitride. The isolation structures 160 may be formed by depositing the dielectric material to fill the openings formed by the fins 130, and then performing a polishing process (such as chemical mechanical polishing) to planarize the upper surface.

Referring now to FIGS. 4A-4B, one or more etching processes are performed to form recesses 170. The recesses 170 are formed by removing portions (but not all) of the material from the isolation structures 160. At this point, the fins 130 partially protrude upwards and out of the isolation structures 160. In other words, portions of the sidewalls of each fin 130 are exposed and not covered by the isolation structures 160. The fins 130 are each formed to have a height 180 measured from a top surface of the fin 130 to an upper surface of the isolation structures 160. In some embodiments, the height 180 is in a range from about 30 nm to about 100 nm.

Referring now to FIGS. 5A-5B, a dielectric layer 190 is formed over the fins 130. The dielectric layer 190 may be formed by a deposition process, for example by a plasma-enhanced chemical vapor deposition (PECVD) process or a plasma-enhanced atomic layer deposition (PEALD) process. In some embodiments, the dielectric layer 190 includes silicon oxide. The dielectric layer 190 is also formed to have a thickness that is in a range from about 1 nm to about 3 nm.

Referring now to FIGS. 6A-6C, dummy gate electrodes 200 are formed over the fins 130 and over the isolation structures 160. The dummy gate electrodes 200 are formed by one or more patterning processes. For example, a polysilicon material is formed over the isolation structures 160. A patterned hard mask 210 is then formed over the polysilicon material. In some embodiments, the patterned hard mask 210 may contain silicon nitride or silicon oxide. The patterned hard mask 210 is then used to pattern (e.g., by one or more etching processes) the polysilicon material below to form the dummy gate electrodes 200. As is shown in FIGS. 6A-6B, the dummy gate electrodes 200 are each formed to wrap around a respective one of the fins 130.

Portions of the dielectric layer 190 not covered by the dummy gate electrodes 200 are removed, thereby exposing the portions of the fins 130 outside of the dummy gate electrodes 200. It is understood that the portions of the dielectric layer 190 located under the dummy gate electrodes 200 may serve as dummy gate dielectric layers.

As is shown in FIG. 6C, portions 130A of the fins 130 located under (and being wrapped around by) the dummy gate electrodes 200 serve as channel regions of the FinFET device 100. A lateral dimension of the channel region 130A measured in the X-direction defines a gate length 220 of the FinFET device 100. In some embodiments, the gate length 220 is in a range between about 8 nm and about 20 nm. Portions of the fins 130 not located directly under the dummy gate electrodes 200 may serve as parts of the source/drain regions of the FinFET device 100.

Figure 7A:
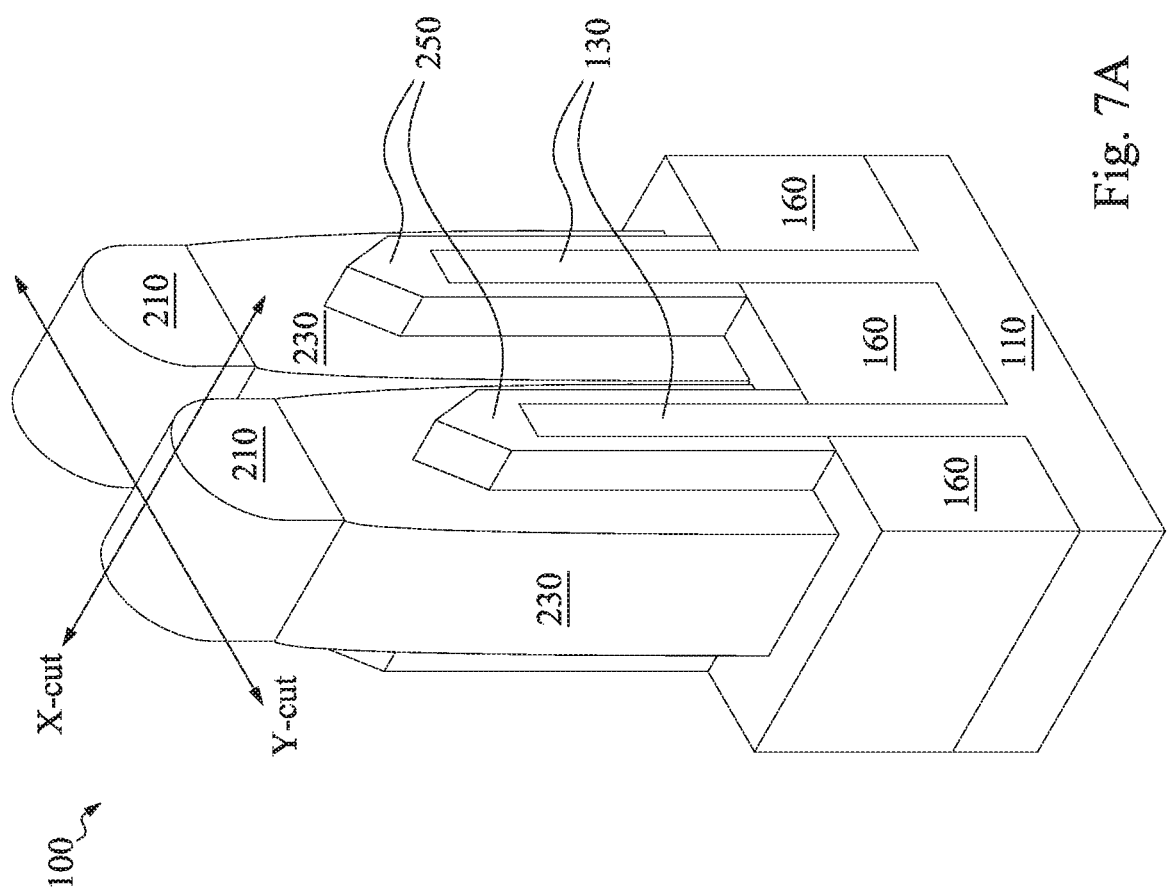

Referring now to FIGS. 7A-7C, gate spacers 230 are formed on sidewalls of the dummy gate electrodes 200. The gate spacers 230 may be formed by depositing a dielectric layer and performing an etching process to the dielectric layer. In various embodiments, the gate spacers 230 may contain silicon oxide, silicon nitride, silicon oxynitride, or combinations thereof.

Source/drain epi regions 250 are formed on the fin structures 130. The source/drain epi regions 250 are formed by epitaxially growing a semiconductor material on the exposed surface of the fins 130. As such, the source/drain epi regions 250 are formed to wrap around the portions of the fins 130 outside of the dummy gate electrodes 200, as shown in FIG. 7A. The source/drain epi regions 250 and the portions of the fins 130 they wrap around may collectively serve as the source/drain components of the FinFET device 100.

The source/drain epi regions 250 have a thickness that is in a range between about 3 nm and about 8 nm. The source/drain epi regions 250 may also be N-type doped or P-type doped, depending on whether the FinFET device 100 is a PFET or an NFET. For N-type doped source/drain regions 250, they may include, as examples, SiP, SiAs, SiGeP, SiGeAs, GeP, GeAs, or other SiGeSn III-V group compounds. For P-type doped source/drain regions 250, they may include, as examples, SiB, SuGa, SiGeB, SiGeGa, GeB, GeGa, or other SiGeSn III-V group compounds.

Figure 8A:
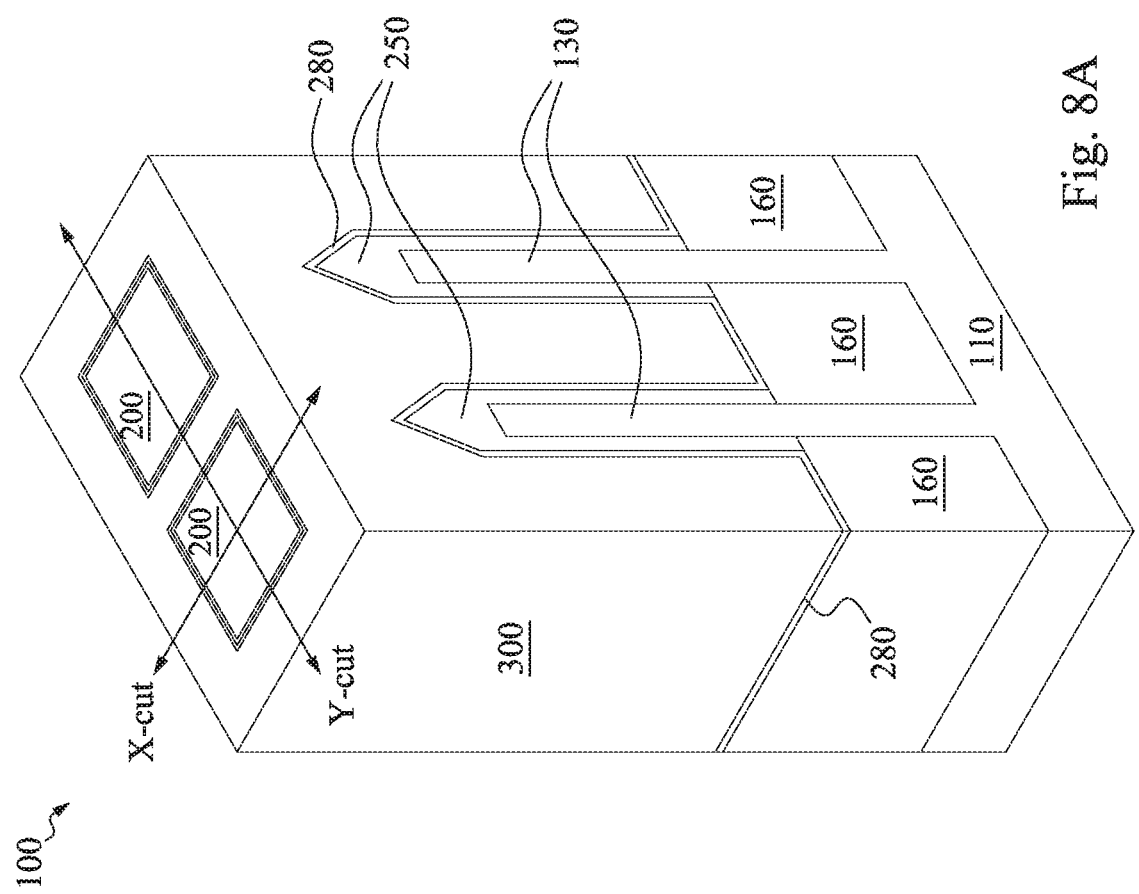

Referring now to FIGS. 8A-8C, an etching-stop layer 280 is formed over the source/drain epi regions 250 and the upper surfaces of the isolation structures 160. Thereafter, an interlayer dielectric (ILD) 300 is formed over the etching-stop layer 280. In some embodiments, the ILD 300 contains silicon oxide. The ILD 300 may be formed by a suitable deposition process. An annealing process may also be performed to the ILD 300. A polishing process such as chemical-mechanical-polishing (CMP) is performed to planarize the upper surface of the ILD 300, which exposes the upper surface of the dummy gate electrodes 200. In some embodiments, another annealing process may be performed to the ILD 300.

Figure 9A:
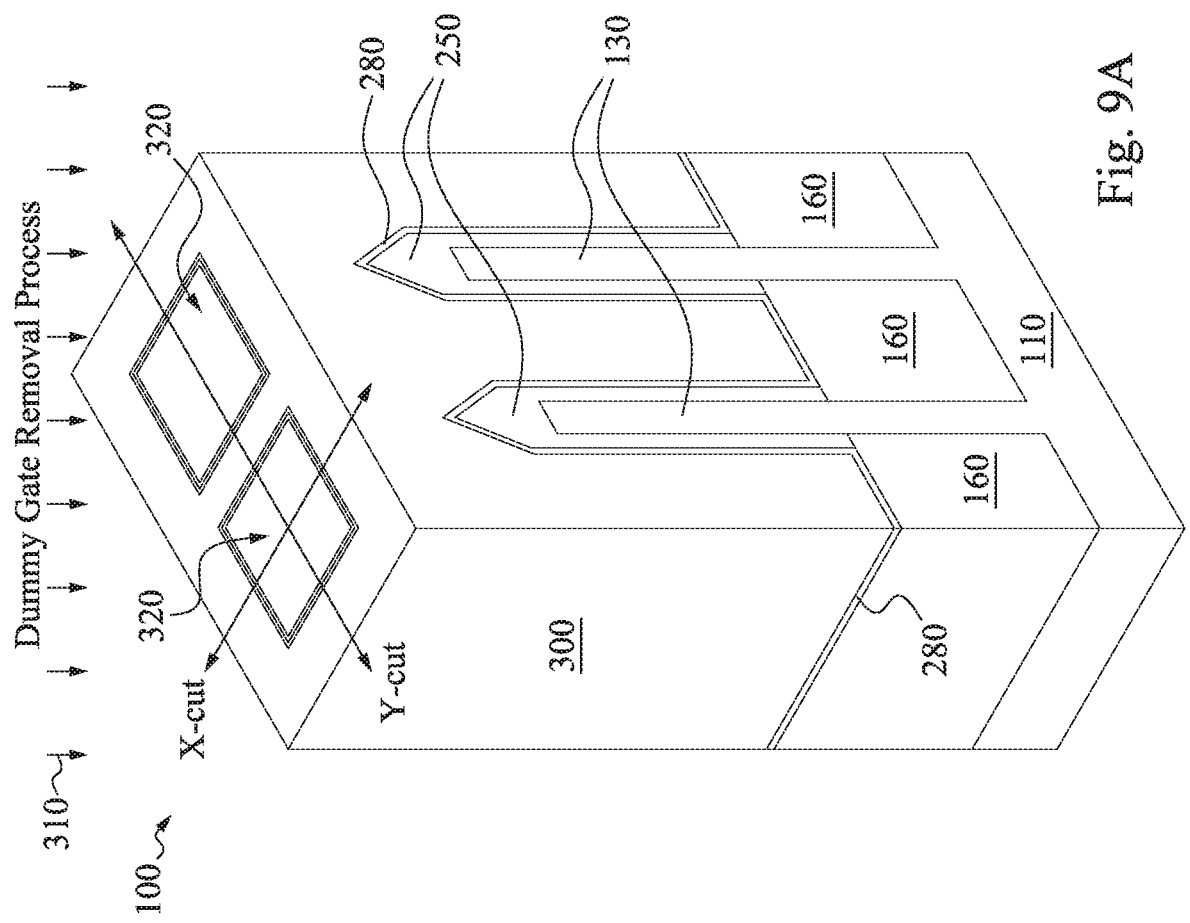

Referring now to FIGS. 9A-9C, a dummy gate removal process 310 is performed to the FinFET device 100 to remove the dummy gate electrodes 200 and the dummy gate dielectric 190. In some embodiments, the dummy gate removal process 310 may include one or more etching processes to etch away the materials of the dummy gate electrodes 200 and the dummy gate dielectric 190. The removal of the dummy gate electrode 200 and the dummy gate dielectric 190 forms recesses or openings 320 in the ILD 300. The sidewalls of the recesses 320 are defined by the gate spacers 230. Meanwhile, the fins 130 are substantially unetched by the dummy gate removal process 310 and remain exposed within the recesses 320.

Figure 10A:
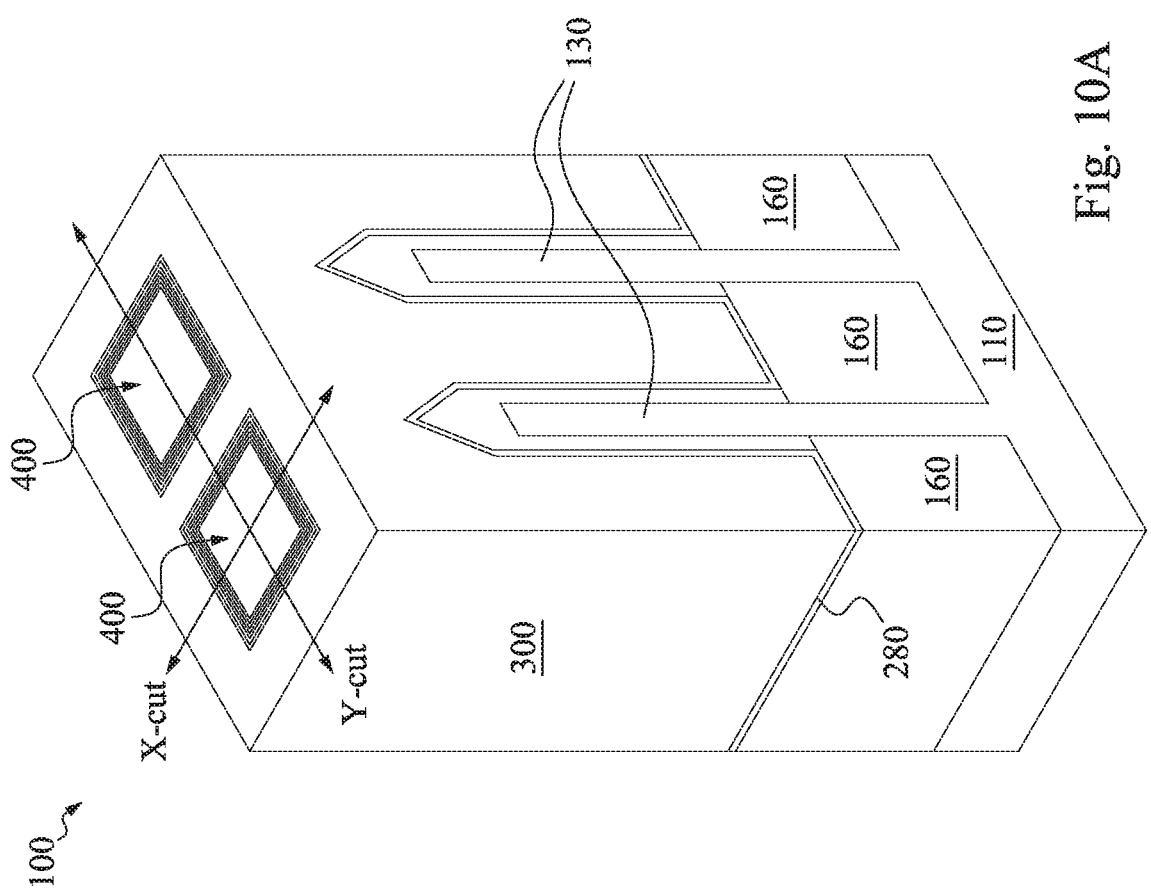

Referring now to FIGS. 10A-10C, functional gate structures 400 are formed in the recesses 320, to replace the removed dummy gate dielectric 190 and the dummy gate electrode 200. First, an interfacial layer 410 is formed on the fins 130, for example on the top surfaces and the sidewalls of the fins 130. The interfacial layer 410 includes a dielectric material, such as silicon oxide ($SiO_2$) in some embodiments, or germanium oxide ($GeO_2$) in some other embodiments. The interfacial layer 410 may be formed by a proper technique, such as an atomic layer deposition (ALD), thermal oxidation, or UV-Ozone Oxidation. In some embodiments, the interfacial layer 410 may have a thickness less than about 10 angstroms.

According to the various aspects of the present disclosure, the interfacial layer 410 may also be doped. For example, the interfacial layer 410 may be doped with yttrium in some embodiments. The interfacial layer 410 may also be doped with lanthanum in some other embodiments. As such, the interfacial layer 410 may comprise yttrium-doped silicon oxide or lanthanum-doped silicon oxide.

The doping of the interfacial layer 410 improves the reliability performance of the FinFET device 100 as a negative-capacitance device. For example, a FET with a doped interfacial layer 410 may have a lower threshold voltage (Vt) and gate current $I_{gate}$, as well as a reduced Vt drift. These improvements may be attributed to a dipole formation at an interface of the interfacial layer 410 and a layer disposed above (e.g., a high-k dielectric layer). The doped interfacial layer 410 also allows the gate structure 400 to provide better positive bias temperature instability (PBTI) immunity due to a lower trapping efficiency.

These improvements discussed above mean that the interfacial layer 410 has more immunity to failure (and as such better reliability). This is beneficial, because if dopants are diffused from a ferroelectric layer into an amorphous layer (as discussed in more detail below), the interfacial layer 410 bears most of the undesirable consequence—a greater voltage drop across the interfacial layer 410. The greater voltage drop across the interfacial layer 410 may wear it out sooner than expected, thus causing a reliability failure of the interfacial layer 410 and the corresponding FinFET device 100. Here, the doping of the interfacial layer 410 makes itself more robust, and thus even if the undesirable dopant diffusion from the ferroelectric layer into the amorphous layer cannot be fully prevented, the interfacial layer 410 is still less likely to fail as a result of having to bear the larger voltage drop. As the reliability of the interfacial layer 410 is improved, the reliability of the overall FinFET device 100 may also be improved.

Next, a layer 420 is formed over the interfacial layer 410. The layer 420 may include multiple sub-layers in some embodiments. These sub-layers are illustrated in FIGS. 11-15, which are magnified Y-cut cross-sectional views of a portion of the functional gate structure 400. For example, FIGS. 11-15 illustrate a portion of the fin 130, a portion of the interfacial layer 410 that wraps around a portion of the fin 130, and portions of one or more of the sub-layers of the layer 420 that are formed over the interfacial layer 410.

Referring to FIG. 11, the layer 420 includes a sub-layer 420A that contains a high-k dielectric material, which has a dielectric constant greater than the dielectric constant of silicon oxide (for example 4-6 times greater). As such, the sub-layer 420A may also be referred to as a high-k dielectric layer. In some embodiments, the sub-layer 420A includes hafnium oxide that is undoped (which may be considered a "pure" hafnium oxide). The sub-layer 420A may also have an amorphous structure. If dopants are diffused into the sub-layer 420A, the amorphous structure of the sub-layer 420A may be turned into a crystalline structure, which is undesirable for reasons discussed in greater detail below. Thus, the present disclosure performs treatment processes and/or forms additional layers to retain the amorphous nature of the sub-layer 420A, as discussed below.

Still referring to FIG. 11, the layer 420 may also include a ferroelectric sub-layer 420B. The ferroelectric sub-layer 420B may be formed using sputtering, PVD, CVD, or the like. The ferroelectric sub-layer 420B may be a crystal layer or have a crystalline structure, for example it may comprise hafnium oxide with an orthorhombic orientation (or orthorhombic phase). Orthorhombic may refer to, or denote, a crystal system or three-dimensional geometric arrangement having three unequal axes at right angles. In some embodiments, the ferroelectric sub-layer 420B may be doped, for example it may be doped with zirconium (Zr).

Referring now to FIG. 12, in some embodiments, a nitridation process 450 may be performed to the sub-layer 420A prior to the formation of the ferroelectric sub-layer 420B. In some embodiments, the nitridation process 450 may be performed by annealing the sub-layer 420A in a nitrogen environment. As a result of the nitridation process 450, a nitridized outer surface 420C is formed on the sub-layer 420A. In some embodiments where the sub-layer 420A includes hafnium oxide, the nitridized outer surface 420C may include hafnium silicon oxynitride (HfSiON). The nitridation of the outer surface 420C of the sub-layer 420A can suppress diffusion of dopants from a layer above (such as from the ferroelectric sub-layer 420B) into the sub-layer 420A.

The suppression of dopant diffusion may improve the performance of the gate structures 400 and the reliability of the FinFET device 100. For example, the fabrication of the FinFET device 100 may involve high temperature environments. For example, one or more annealing processes may be performed as a part of the formation of the functional gate structure 400. In some embodiments, such annealing processes may be performed during or after the formation of the ferroelectric sub-layer 420B.

As discussed above, the ferroelectric sub-layer 420B may be doped with a dopant. During the high temperature processes, the dopant from the ferroelectric sub-layer 420B may diffuse into the sub-layer 420A below. This undesirable dopant diffusion into the sub-layer 420A may transform the amorphous materials (e.g., undoped hafnium oxide) of the sub-layer 420A into more crystalline-structured materials. To the extent that such crystalline-structured materials of the dopant-diffused layer 420A has a ferroelectric effect, it may cause a drop of the negative voltage on the ferroelectric sub-layer 420B and the sub-layer 420A. As a result, there is now a higher voltage drop across the interfacial layer 410, which could degrade the reliability of the interfacial layer 410 and the FinFET device 100.

For these reasons discussed above, the present disclosure aims to retain the amorphous structure of the sub-layer 420A, for example by preventing or reducing the dopants diffusion from the ferroelectric sub-layer 420B into the sub-layer 420A. Here, the formation of the nitridized surface 420C is one way to suppress the undesirable dopant diffusion from the ferroelectric sub-layer 420B into the sub-layer 420A. Consequently, the reliability of the FinFET device 100 is improved.

Referring now to FIG. 13, in some embodiments, instead of or in addition to nitridizing the outer surface of the sub-layer 420A, the layer 420 may further include a diffusion-barrier sub-layer 420D that is located between the ferroelectric sub-layer 420B and the sub-layer 420A. In some embodiments, the diffusion-barrier sub-layer 420D includes a metal-containing layer, such as tantalum (Ta) or tantalum nitride (TaN). In other embodiments, the diffusion-barrier sub-layer 420D includes a metal-oxide-containing layer, such as aluminum oxide ($Al_2O_3$) or tantalum oxide ($Ta_2O_5$). In some other embodiments, the diffusion-barrier sub-layer 420D may include a combination of one or more metals and metal oxides. The presence of the diffusion-barrier sub-layer 420D also prevents or reduces the undesirable dopant diffusion from the ferroelectric sub-layer 420B into the sub-layer 420A, and as such it improves the reliability of the FinFET device 100.

Referring now to FIG. 14, in some embodiments, instead of or in addition to nitridizing the outer surface of the sub-layer 420A, and/or implementing the diffusion-barrier sub-layer 420D, the layer 420 may further include a seed sub-layer 420E that is located between the ferroelectric sub-layer 420B and the sub-layer 420A. In some embodiments, the seed sub-layer 420E may be formed by a plasma-enhanced atomic layer deposition (PEALD) process.

The seed sub-layer 420E is configured to lower the temperature of a high-temperature annealing process (to be performed later) to achieve a specific orientation (e.g., the orthorhombic orientation) in the ferroelectric sub-layer 420B. For example, without the formation of the seed sub-layer 420E, an annealing process may typically need a process temperature of X (e.g., 650<X<750) degrees Celsius to achieve the orthorhombic orientation in the ferroelectric sub-layer 420B. However, with the formation of the seed sub-layer 420E, the annealing process may need just a process temperature of Y (e.g., 450<Y<550) degrees Celsius to achieve the orthorhombic orientation in the ferroelectric sub-layer 420B, where Y is less than X.

In some embodiments, the seed sub-layer 420E includes zirconium oxide ($ZrO_2$) to facilitate the deposition of a hafnium zirconium oxide ($HfZrO_2$) material as the ferroelectric sub-layer 420B. In some embodiments, a large stable ferroelectric orthorhombic phase zirconium oxide layer can be deposited (as the seed sub-layer 420E) without a high temperature annealing process. Thereafter, the hafnium zirconium oxide material (as the ferroelectric sub-layer 420B) can be deposited on the orthorhombic-phase zirconium oxide with a lower annealing temperature, while still being able to achieve the orthorhombic phase.

Referring now to FIG. 15, in an embodiment of the present disclosure, the layer 420 includes all of the sub-layers 420A-420E discussed above. For example, an undoped high-k dielectric material such as hafnium oxide is formed as the sub-layer 420A to wrap around the interfacial layer 410, where the interfacial layer 410 itself may be doped (e.g., doped with yttrium or doped with lanthanum). The amorphous sub-layer 420A has an amorphous structure. The sub-layer 420A has nitridized outer surfaces 420C, which may be formed by a nitridation process such as the nitridation process 450 discussed above with reference to FIG. 12. The diffusion-barrier sub-layer 420D is formed on the nitridized surface 420C of the sub-layer 420A. The seed sub-layer 420E is formed on the diffusion-barrier sub-layer 420D. The ferroelectric sub-layer 420B is formed on the seed sub-layer 420E.

As discussed above, the doping of the interfacial layer 410 and the formation of the various sub-layers of the layer 420 can improve the reliability of the FinFET device as a negative-capacitance device. For example, the doping of the interfacial layer 410 can lower the threshold voltage Vt and its drift. The nitridized surface 420C and the diffusion-barrier sub-layer 420D can prevent or reduce the undesirable diffusion of dopants from the ferroelectric sub-layer 420B into the amorphous sub-layer 420A. The seed sub-layer 420E allows the deposition of the ferroelectric sub-layer 420B to be performed without requiring a high annealing temperature.

It is understood that the benefits of the present disclosure may still be achieved even if one or more of the sub-layers 420C/D/E is missing (such as the case in the embodiments shown in FIGS. 11-14), or if the interfacial layer 410 is undoped. In other words, the present disclosure allows for different combinations of the sub-layers 420C/D/E (none of which is required), as well as the doping or undoping of the interfacial layer 410.

Referring back to FIGS. 10A-10C, a capping layer 510 is formed on the layer 420, for example on the ferroelectric sub-layer 420B discussed above. In some embodiments, the capping layer 510 may include a metal material. In some embodiments, an annealing process may be performed after the formation of the capping layer. The annealing process may be performed at a relatively high temperature. As discussed above, the high temperature of the annealing process would have led to the undesirable dopant diffusion from the ferroelectric layer (e.g., the sub-layer 420B in FIG. 15) to the amorphous high-k dielectric layer (e.g., the sub-layer 420A in FIG. 15). However, the nitridized outer surface (e.g., the surface 420C in FIG. 15) of the amorphous high-k dielectric layer and/or the diffusion-barrier layer (e.g., the sub-layer 420D in FIG. 15) substantially prevent or reduce such undesirable dopant diffusion. In addition, the formation of the seed layer (e.g., the sub-layer 420E in FIG. 15) also allows the annealing process to be performed with a lower process temperature, while still allowing the ferroelectric layer to achieve a desired orientation (e.g., the orthorhombic orientation). As such, the annealing process can be performed after the formation of the capping layer 510 without degrading device performance or reliability.

Still referring to FIGS. 10A-10C, a barrier layer 520 is formed on the capping layer 510. In some embodiments, the barrier layer 520 may include a metal material that is different than the metal material of the capping layer 510. A work function metal layer 530 is formed on the barrier layer 520. The work functional metal layer 530 is configured to tune a work function of the FinFET device 100 to achieve a desired threshold voltage Vt. In some embodiments, the work function metal component may contain: TiAl, TiAlN, TaCN, TiN, WN, or W, or combinations thereof. A glue layer 540 is formed on the work function metal layer 530. The glue layer 540 is configured to facilitate the subsequent formation of a fill metal layer. A fill metal layer 550 is formed on the glue layer 540. The fill metal layer 550 is configured to serve as the main conductive portion of the functional gate structure 400. In various embodiments, the fill metal layer 550 may contain Aluminum (Al), Tungsten (W), Copper (Cu), or combinations thereof. One or more polishing processes may also be performed to planarize the upper surfaces of the functional gate structure 400.

It is understood that although the embodiments discussed above use the FinFET device 100 as an example for implementing the various aspects of the present disclosure, the various aspects of the present disclosure may be applicable to non-FinFET devices as well, for example to planar devices that use a high-k metal gate. In addition, the various aspects of the present disclosure are also applicable to multiple technologies (e.g., N45, N20, N16, N10, and beyond). Furthermore, the various aspects of the present disclosure are not necessarily limited to negative-capacitance applications either.

FIG. 16 is a flowchart of a method 900 for fabricating a semiconductor device according to embodiments of the present disclosure. In some embodiments, the semiconductor device includes a negative-capacitance FET.

The method 900 includes a step 910 of forming an interfacial layer over a semiconductor layer. In some embodiments, a fin structure is formed as the semiconductor layer. The interfacial layer is formed to wrap around an upper surface and sidewalls of the fin structure. In some embodiments, the forming of the interfacial layer comprises doping the interfacial layer. In some embodiments, the doping of the interfacial layer comprises doping the interfacial layer with yttrium or lanthanum.

The method 900 includes a step 920 of forming an amorphous dielectric layer over the interfacial layer. In some embodiments, the forming of the amorphous dielectric layer comprises forming an undoped hafnium oxide layer as the amorphous dielectric layer.

The method 900 includes a step 930 of forming at least a first layer or a second layer over the amorphous layer. In some embodiments, the forming the at least the first layer or the second layer comprises: forming the first layer over the amorphous layer; and forming the second layer over the first layer. In some embodiments, the forming of the first layer comprises forming a diffusion-barrier layer as the first layer, and wherein the diffusion-barrier layer is formed to contain a metal or a metal oxide.

The method 900 includes a step 940 of forming a ferroelectric layer over the first layer or over the second layer, wherein the ferroelectric layer includes dopants. In some embodiments, the forming of the second layer and the forming of the ferroelectric layer are performed such that: the ferroelectric layer has a crystalline structure, and the second layer and the ferroelectric layer each have an orthorhombic orientation.

The method 900 includes a step 950 of performing an annealing process after the forming of the ferroelectric layer. In some embodiments, if the first layer is formed, the first layer prevents the dopants of the ferroelectric layer from being diffused into the amorphous layer during the performing of the annealing process. In some embodiments, if the second layer is formed, the second layer serves as a seed layer to facilitate the forming of the ferroelectric layer.

The method 900 includes a step 960 of forming a metal gate electrode after the annealing process is performed. The metal gate electrode may include a work function metal and a fill metal.

It is understood that additional process steps may be performed before, during, or after the steps 910-950 discussed above to complete the fabrication of the semiconductor device. For example, the method 900 may further include a step of performing a nitridation process to nitridize an outer surface of the amorphous dielectric layer. As another example, an interconnect structure including conductive contacts, vias, and interconnect lines may be formed. Additionally, testing and packaging steps may be performed to complete the fabrication of an integrated circuit.

Based on the above discussions, it can be seen that the present disclosure offers advantages over conventional negative-capacitance FETs and the fabrication thereof. It is understood, however, that other embodiments may offer additional advantages, and not all advantages are necessarily disclosed herein, and that no particular advantage is required for all embodiments.

One advantage is that, by doping the interfacial layer, the resulting gate stack may have a lower threshold voltage or a smaller threshold voltage drift. The doped interfacial layer is also more robust and less likely to fail even under harsher conditions (e.g., having to handle a larger voltage swing).

Another advantage is that the nitridized outer surface of the amorphous high-k dielectric layer and/or the diffusion-barrier layer can each suppress or prevent the diffusion of the dopants from the ferroelectric layer into the amorphous layer. The dopant diffusion is undesirable because it may transform the amorphous layer into a more crystalline-like structure, which would interfere with the negative-capacitance functionality and degrade the reliability of the resulting FET. Since the nitridized outer surface of the amorphous layer and the diffusion-barrier layer can suppress or prevent the undesirable dopant diffusion, the performance and reliability of the negative-capacitance FET may be improved.

Yet another advantage is the seed layer (formed over the amorphous high-k dielectric layer and before the formation of the ferroelectric layer) facilitates the formation of the ferroelectric layer. For example, the seed layer may be formed to have a crystalline orientation (e.g., an orthorhombic orientation) that the ferroelectric layer is supposed to achieve. This allows the annealing process (which is performed after the deposition of the ferroelectric layer) to have a lower process temperature, while still achieving the desired crystalline orientation for the ferroelectric layer. The lower annealing process temperature may also lead to less dopant diffusion, and as discussed above, a reduction in dopant diffusion may improve the negative-capacitance FET's performance and reliability. Other advantages may include compatibility with existing fabrication process flow and ease of implementation.

One embodiment of the present disclosure involves a device. The device includes: a semiconductor layer; an interfacial layer disposed over the semiconductor layer; an amorphous dielectric layer disposed over the interfacial layer; a ferroelectric layer disposed over the amorphous dielectric layer; and a metal gate electrode disposed over the ferroelectric layer; wherein at least one of the following is true: the interfacial layer is doped; the amorphous dielectric layer has a nitridized outer surface; a diffusion-barrier layer is disposed between the amorphous dielectric layer and the ferroelectric layer; or a seed layer is disposed between the amorphous dielectric layer and the ferroelectric layer. In some embodiments, the semiconductor layer includes a fin of a FinFET device. In some embodiments, the device includes a negative-capacitance device. In some embodiments, the interfacial layer is doped with yttrium or lanthanum. In some embodiments, the ferroelectric layer is doped. In some embodiments, the ferroelectric layer includes a crystalline structure. In some embodiments, the crystalline structure has an orthorhombic orientation. In some embodiments, the nitridized outer surface includes hafnium silicon oxynitride. In some embodiments, the diffusion-barrier layer includes a metal or a metal oxide. In some embodiments, the seed layer includes zirconium oxide.

Another embodiment of the present disclosure involves a device. The device includes: a fin structure; a doped interfacial layer wrapping around the fin structure; an undoped amorphous high-k dielectric layer located over the doped interfacial layer, wherein the undoped amorphous high-k dielectric layer has a nitridized outer surface; a diffusion-barrier layer located over the nitridized outer surface of the undoped amorphous high-k dielectric layer; a seed layer located over the diffusion-barrier layer; and a doped ferroelectric layer located over the seed layer, wherein the doped ferroelectric layer has a crystalline structure.

Another embodiment of the present disclosure involves a method of fabricating a semiconductor device. The method includes: forming an interfacial layer over a semiconductor layer; forming an amorphous dielectric layer over the interfacial layer; forming at least a first layer or a second layer over the amorphous dielectric layer; forming a ferroelectric layer over the first layer or over the second layer, wherein the ferroelectric layer includes dopants; and performing an annealing process after the forming of the ferroelectric layer; wherein: the first layer prevents the dopants of the ferroelectric layer from being diffused into the amorphous layer during the performing of the annealing process; and the second layer serves as a seed layer to facilitate the forming of the ferroelectric layer. In some embodiments, the method further includes: forming a fin structure as the semiconductor layer, wherein the forming of the interfacial layer is performed such that the interfacial layer wraps around an upper surface and sidewalls of the fin structure. In some embodiments, the forming of the interfacial layer comprises doping the interfacial layer. In some embodiments, the doping of the interfacial layer comprises doping the interfacial layer with yttrium or lanthanum. In some embodiments, the forming of the amorphous dielectric layer comprises forming an undoped hafnium oxide layer as the amorphous dielectric layer. In some embodiments, the forming the at least the first layer or the second layer comprises: forming the first layer over the amorphous dielectric layer; and forming the second layer over the first layer. In some embodiments, the forming of the first layer comprises forming a diffusion-barrier layer as the first layer, and wherein the diffusion-barrier layer is formed to contain a metal or a metal oxide. In some embodiments, the forming of the second layer and the forming of the ferroelectric layer are performed such that: the ferroelectric layer has a crystalline structure; and the second layer and the ferroelectric layer each have an orthorhombic orientation. In some embodiments, the method further includes: performing a nitridation process to nitridize an outer surface of the amorphous dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A negative capacitance device, comprising:
   a semiconductor layer;
   an interfacial layer disposed over the semiconductor layer, wherein the interfacial layer is doped;
   an amorphous dielectric layer disposed over the interfacial layer, wherein the amorphous dielectric layer has a nitridized surface; and
   a ferroelectric layer disposed over the amorphous dielectric layer.

2. The negative capacitance device of claim 1, wherein the interfacial layer is doped with yttrium or lanthanum.

3. The negative capacitance device of claim 1, wherein the nitridized surface includes hafnium silicon oxynitride.

4. The negative capacitance device of claim 1, further comprising: a diffusion-barrier layer disposed between the amorphous dielectric layer and the ferroelectric layer, wherein the diffusion-barrier layer includes a metal or a metal oxide.

5. The negative capacitance device of claim 4, wherein the metal oxide includes aluminum oxide ($Al_2O_3$).

6. The negative capacitance device of claim 4, wherein the metal oxide includes tantalum oxide ($Ta_2O_5$).

7. The negative capacitance device of claim 1, further comprising: a seed layer disposed between the amorphous dielectric layer and the ferroelectric layer, wherein the seed layer includes zirconium oxide.

8. The negative capacitance device of claim 7, wherein the seed layer has a crystalline orientation.

9. The negative capacitance device of claim 7, wherein the zirconium oxide of the seed layer includes a ferroelectric orthorhombic phase zirconium oxide.

10. The negative capacitance device of claim 1, wherein the ferroelectric layer is doped.

11. A negative capacitance device, comprising:
a semiconductor layer;
an amorphous dielectric layer disposed over semiconductor layer;
a seed layer disposed over the amorphous dielectric layer, wherein the seed layer has a crystalline orientation; and
a ferroelectric layer disposed over the seed layer.

12. The negative capacitance device of claim 11, wherein the seed layer contains a ferroelectric orthorhombic phase zirconium oxide.

13. The negative capacitance device of claim 11, further including: an interfacial layer disposed between the semiconductor layer and the amorphous dielectric layer, wherein the interfacial layer is doped with yttrium or lanthanum.

14. The negative capacitance device of claim 11, further including: a diffusion-barrier layer disposed between the amorphous dielectric layer and the seed layer, wherein the diffusion-barrier layer includes aluminum oxide ($Al_2O_3$) or tantalum oxide ($Ta_2O_5$).

15. The negative capacitance device of claim 11, wherein the amorphous dielectric layer has a nitridized upper surface.

16. The negative capacitance device of claim 11, wherein the ferroelectric layer is doped with zirconium.

17. A negative capacitance device, comprising:
a semiconductor layer;
an interfacial layer disposed over the semiconductor layer, wherein the interfacial layer is doped with yttrium or lanthanum;
an amorphous dielectric layer disposed over the interfacial layer;
a seed layer disposed over the amorphous dielectric layer, wherein the seed layer contains a ferroelectric orthorhombic phase zirconium oxide; and
a doped ferroelectric layer disposed over the seed layer.

18. The negative capacitance device of claim 17, further including: a diffusion-barrier layer disposed between the amorphous dielectric layer and the seed layer, wherein the diffusion-barrier layer includes aluminum oxide ($Al_2O_3$) or tantalum oxide ($Ta_2O_5$).

19. The negative capacitance device of claim 17, wherein:
the amorphous dielectric layer has a nitridized upper surface; and
the doped ferroelectric layer is doped with zirconium.

20. The negative capacitance device of claim 19, wherein the nitridized upper surface includes hafnium silicon oxynitride.

* * * * *